US012603253B2

(12) United States Patent
Tsubota et al.

(10) Patent No.: US 12,603,253 B2
(45) Date of Patent: Apr. 14, 2026

(54) SUBSTRATE PROCESSING APPARATUS, METHOD OF MANUFACTURING SEMICONDUCTOR DEVICE, AND RECORDING MEDIUM

(71) Applicant: Kokusai Electric Corporation, Tokyo (JP)

(72) Inventors: Yasutoshi Tsubota, Toyama (JP); Masanori Nakayama, Toyama (JP); Katsunori Funaki, Toyama (JP); Tatsushi Ueda, Toyama (JP); Yuichiro Takeshima, Toyama (JP); Keita Ichimura, Toyama (JP); Hiroto Igawa, Toyama (JP); Yuki Yamakado, Toyama (JP); Hiroki Kishimoto, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 830 days.

(21) Appl. No.: 17/853,248

(22) Filed: Jun. 29, 2022

(65) Prior Publication Data

US 2022/0328289 A1     Oct. 13, 2022

Related U.S. Application Data

(63) Continuation of application No. PCT/JP2020/010543, filed on Mar. 11, 2020.

(51) Int. Cl.
*H01J 37/32* (2006.01)
(52) U.S. Cl.
CPC .. *H01J 37/32449* (2013.01); *H01J 37/32183* (2013.01); *H01J 37/32541* (2013.01);
(Continued)

(58) Field of Classification Search
CPC ........... H01J 37/32568; H01J 37/32807; H01J 37/3288; H01J 37/32889; H01J 37/32477
See application file for complete search history.

(56) References Cited

U.S. PATENT DOCUMENTS 5,354,413 A * 10/1994 Smesny ............ H01J 37/32009
156/345.47
5,690,781 A 11/1997 Yoshida et al.
(Continued)

FOREIGN PATENT DOCUMENTS

JP 8-88190 A 4/1996
JP 8-330281 A 12/1996
(Continued)

OTHER PUBLICATIONS

International Search Report, PCT/JP2020/010543, Jul. 21, 2020, 7 pgs.
(Continued)

*Primary Examiner* — Karl Kurple
(74) *Attorney, Agent, or Firm* — Volpe Koenig

(57) ABSTRACT

There is provided a technique that includes a process container including a cylindrical portion, a process chamber being formed in the process container and a substrate being arranged in the process chamber; a gas supplier configured to supply a processing gas to the process chamber; an electrode installed in a spiral shape to surround the process container from outside of the cylindrical portion of the process container and supplied with high-frequency power to plasma-excite the processing gas; and a mover configured to be capable of moving the electrode with respect to the process container in a radial direction of the cylindrical portion.

16 Claims, 13 Drawing Sheets

(52) U.S. Cl.
    CPC .. *H01J 37/32559* (2013.01); *H01J 37/32568*
                (2013.01); *H01J 37/32798* (2013.01)

(56) References Cited

U.S. PATENT DOCUMENTS

| | | | |
|---|---|---|---|
| 5,855,725 A | 1/1999 | Sakai | |
| 6,733,620 B1 | 5/2004 | Sugiyama et al. | |
| 11,555,247 B2 * | 1/2023 | Zong | H01L 21/68771 |
| 2002/0179245 A1 * | 12/2002 | Masuda | H01J 37/32458 |
| | | | 156/345.1 |
| 2006/0070703 A1 | 4/2006 | Johnson et al. | |
| 2010/0193128 A1 * | 8/2010 | Koumura | H03H 7/38 |
| | | | 118/712 |
| 2012/0298303 A1 * | 11/2012 | Ikeda | H05H 1/46 |
| | | | 156/345.48 |
| 2012/0320361 A1 * | 12/2012 | Ishikawa | H01L 21/67748 |
| | | | 355/72 |
| 2014/0106573 A1 | 4/2014 | Terasaki et al. | |
| 2014/0175055 A1 * | 6/2014 | Sasagawa | H01J 37/321 |
| | | | 216/68 |
| 2015/0064810 A1 * | 3/2015 | Liu | H01J 37/32862 |
| | | | 156/345.29 |
| 2016/0293388 A1 * | 10/2016 | Chen | H01J 37/32568 |
| 2017/0287677 A1 | 10/2017 | Kato | |
| 2019/0032217 A1 | 1/2019 | Yoshino et al. | |
| 2020/0081423 A1 * | 3/2020 | Clark | G05B 13/027 |
| 2020/0219699 A1 | 7/2020 | Yasui et al. | |
| 2020/0321198 A1 * | 10/2020 | Huang | H01J 37/321 |
| 2022/0093436 A1 * | 3/2022 | Kustra | H01J 37/32091 |
| 2023/0018842 A1 * | 1/2023 | Jiangang | H01L 21/67323 |

FOREIGN PATENT DOCUMENTS

| | | |
|---|---|---|
| JP | 11-67729 A | 3/1999 |
| JP | 11-317397 A | 11/1999 |
| JP | 2006-253250 A | 9/2006 |
| JP | 2008-516426 A | 5/2008 |
| JP | 2009-239210 A | 10/2009 |
| JP | 2014-75579 A | 4/2014 |
| JP | 2017-183379 A | 10/2017 |
| TW | I481317 B | 4/2015 |
| WO | 2012/073449 A1 | 6/2012 |
| WO | 2019/082569 A1 | 5/2019 |

OTHER PUBLICATIONS

Taiwan Office Action issued on Apr. 25, 2022 for Taiwan Patent Application No. 110103429.
Extended European Search Report issued on Oct. 25, 2023 for European Patent Application No. 20923891.4.

* cited by examiner

FIG. 7

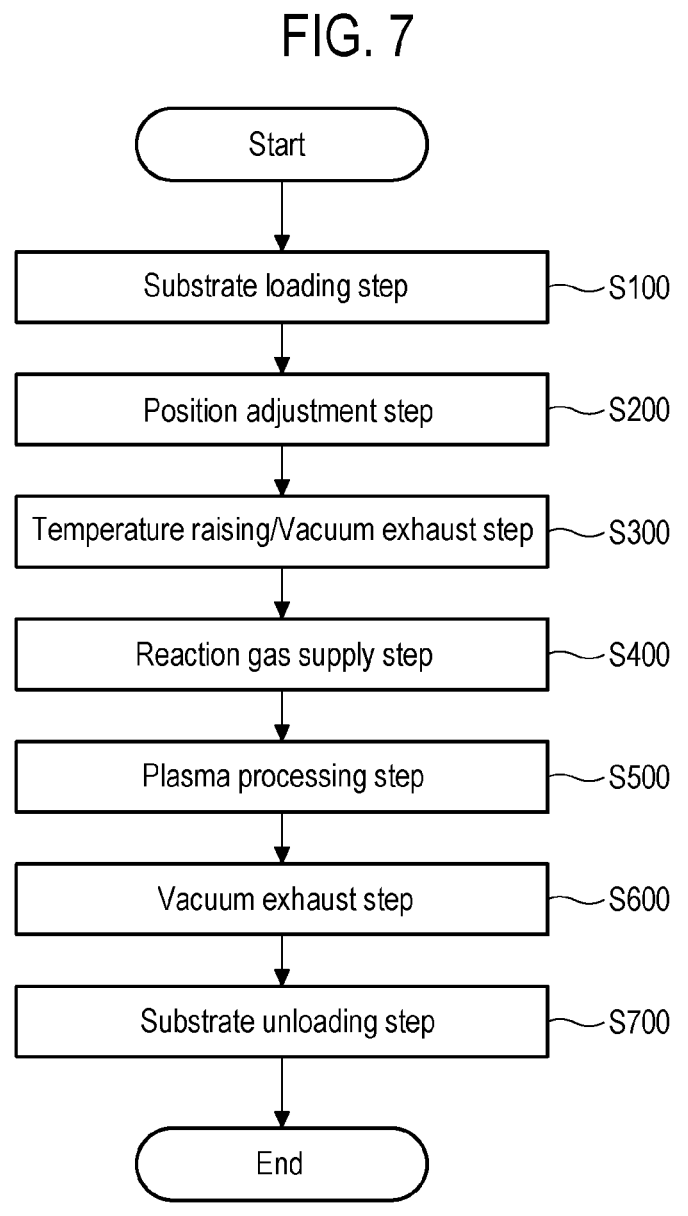

Start

↓

| Substrate loading step | ⟩S100 |

↓

| Position adjustment step | ⟩S200 |

↓

| Temperature raising/Vacuum exhaust step | ⟩S300 |

↓

| Reaction gas supply step | ⟩S400 |

↓

| Plasma processing step | ⟩S500 |

↓

| Vacuum exhaust step | ⟩S600 |

↓

| Substrate unloading step | ⟩S700 |

↓

End

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is a Bypass Continuation application of PCT International Application No. PCT/JP2020/010543, filed on Mar. 11, 2020 and designating the United States, the entire contents of which are incorporated herein by reference.

TECHNICAL FIELD

The present disclosure relates to a substrate processing apparatus, a method of manufacturing a semiconductor device, and a recording medium.

BACKGROUND

In recent years, semiconductor devices such as flash memories and the like have tended to be highly integrated. Along with this, the pattern size has been remarkably miniaturized. When forming these patterns, as a manufacturing process, a process of performing a predetermined process such as an oxidation process or a nitriding process on a substrate may be carried out.

For example, in the related art, it is known that a pattern surface formed on a substrate is modified using a plasma-excited processing gas.

In the configuration of the related art, due to the variation in the shape of a process container in which a process chamber for processing a substrate is arranged, the variation in the position of an electrode that surrounds the process container and generates plasma in a spiral shape, the variation in the strength of the electromagnetic field generated from the electrode, and the difference in the processing conditions for processing the substrate, the plasma distribution in the process container may not be a desired distribution along the circumferential direction of the process container.

SUMMARY

According to one embodiment of the present disclosure, there is provided a technique that includes a process container including a cylindrical portion, a process chamber being formed in the process container and a substrate being arranged in the process chamber; a gas supplier configured to supply a processing gas to the process chamber; an electrode installed in a spiral shape to surround the process container from outside of the cylindrical portion of the process container and supplied with high-frequency power to plasma-excite the processing gas; and a mover configured to be capable of moving the electrode with respect to the process container in a radial direction of the cylindrical portion.

BRIEF DESCRIPTION OF DRAWINGS

The accompanying drawings, which are incorporated in and constitute a part of the specification, illustrate embodiments of the present disclosure.

FIG. 7 is a flow chart showing the respective steps of a method of manufacturing a semiconductor device according to a first embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

An example of a first embodiment of the present disclosure will be described with reference to FIGS. 1 to 7. The arrow H shown in each figure indicates a vertical direction and an apparatus up/down direction, the arrow W indicates a horizontal direction and an apparatus width direction, and the arrow D indicates a horizontal direction and an apparatus depth direction.

(Substrate Processing Apparatus 100)

The substrate processing apparatus 100 according to a first embodiment is configured to mainly perform an oxidation process on a film formed on a substrate.

Figure 1:
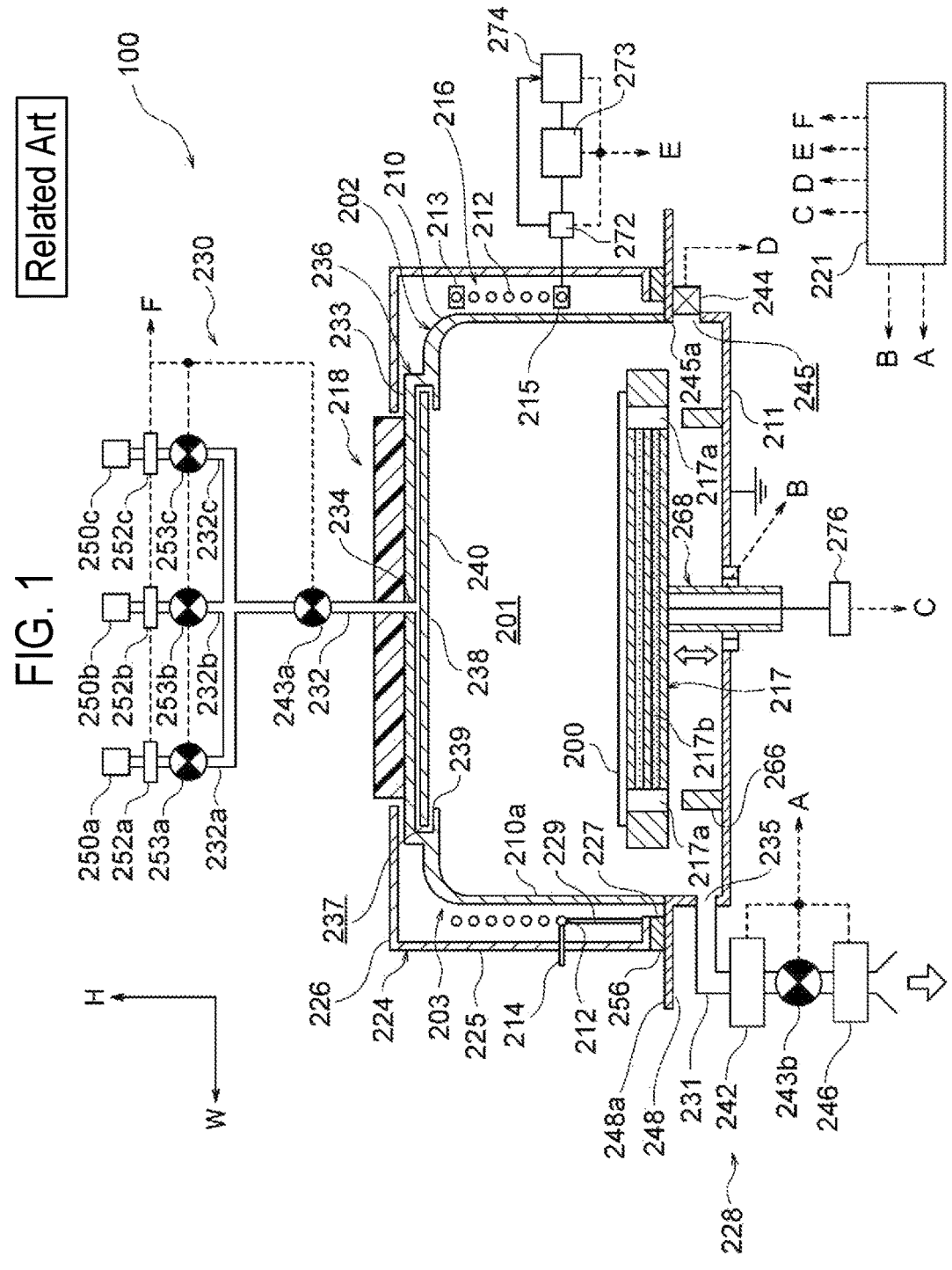
FIG. 1 is a schematic configuration diagram showing a substrate processing apparatus according to a first embodiment of the present disclosure.

As shown in FIG. 1, the substrate processing apparatus 100 includes a process furnace 202 for plasma-processing a wafer 200. The process furnace 202 is installed with a process container 203 constituting a process chamber 201. The process container 203 includes a dome-shaped upper container 210 as a first container and a bowl-shaped lower container 211 as a second container. Further, the substrate processing apparatus 100 includes a base plate 248 that surrounds the upper end of the lower container 211 and has a through-hole formed therein.

The upper container 210 includes a cylindrical portion (tubular portion) 210a extending in the vertical direction, and the process chamber 201 is formed by covering the upper container 210 on the lower container 211. The upper container 210 is made of a non-metallic material such as aluminum oxide ($Al_2O_3$) or quartz ($SiO_2$), and the lower container 211 is made of, for example, aluminum (Al). The wafer 200 is an example of a substrate.

Further, a gate valve 244 is installed on the lower side wall of the lower container 211. When the gate valve 244 is opened, the wafer 200 can be loaded into the process chamber 201 or unloaded from the process chamber 201 via a loading/unloading port 245 by using a transfer mechanism (not shown). The gate valve 244 is configured to, when closed, serve as a partitioning valve that maintains the airtightness of the process chamber 201.

Figure 2:
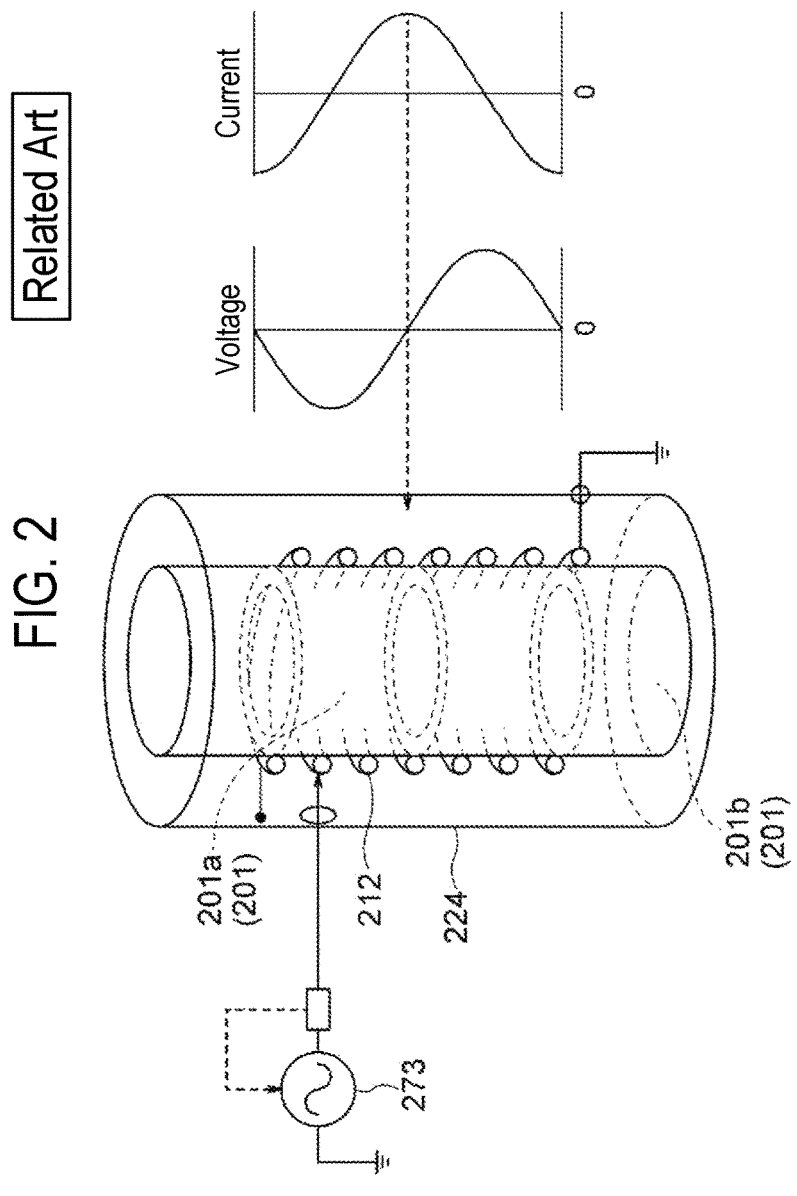
FIG. 2 is a perspective view showing a shielding plate, a resonance coil, and the like of the substrate processing apparatus according to the first embodiment of the present disclosure.

As shown in FIG. 2, the process chamber 201 includes a plasma generation space 201a around which a resonance coil 212 is installed, and a substrate processing space 201b that communicates with the plasma generation space 201a and processes the wafer 200. The plasma generation space 201a refers to a space in which plasma is generated, and a space which is defined above the lower end of the resonance coil 212 and below the upper end of the resonance coil 212 in the process chamber. On the other hand, the substrate processing space 201b refers to a space in which a substrate is processed by plasma, and a space below the lower end of the resonance coil 212. In the present embodiment, the diameters of the plasma generation space 201a and the substrate processing space 201b in the horizontal direction are substantially the same.

[Susceptor 217]

As shown in FIG. 1, the susceptor 217 as a substrate mounting table on which the wafer 200 is mounted is arranged at the center of the bottom-side of the process chamber 201.

A heater 217b as a heating mechanism is integrally embedded inside the susceptor 217. The heater 217b is configured to be able to heat the surface of the wafer 200, for example, from about 25 degrees C. to 750 degrees C. when supplied with electric power.

Further, a susceptor elevator 268 including a drive mechanism for raising or lowering the susceptor is installed in the susceptor 217. Moreover, through-holes 217a are formed in the susceptor 217, and wafer push-up pins 266 are installed on a bottom surface of the lower container 211. When the susceptor 217 is lowered by the susceptor elevator 268, the wafer push-up pins 266 are configured to penetrate the through-holes 217a without making contact with the susceptor 217.

A substrate mounting table according to the present embodiment is mainly composed of the susceptor 217 and the heater 217b.

[Gas Supplier 230]

As shown in FIG. 1, the gas supplier 230 is installed above the process chamber 201. Specifically, a gas supply head 236 is installed above the process chamber 201, i.e., on the upper portion of the upper container 210. The gas supply head 236 includes a cap-shaped lid 233, a gas introduction port 234, a buffer chamber 237, an opening 238, a shielding plate 240, and a gas outlet 239. The gas supply head 236 is configured to supply a reaction gas to the process chamber 201.

A downstream end of an oxygen-containing gas supply pipe 232a for supplying an oxygen ($O_2$) gas as an oxygen-containing gas, a downstream end of a hydrogen-containing gas supply pipe 232b for supplying a hydrogen ($H_2$) gas as a hydrogen-containing gas, and an inert gas supply pipe 232c for supplying an argon (Ar) gas as an inert gas are connected to the gas introduction port 234 so as to merge.

On the oxygen-containing gas supply pipe 232a, an $O_2$ gas supply source 250a, a mass flow controller (MFC) 252a as a flow rate control device, and a valve 253a as an on-off valve are installed sequentially from the upstream side. On the hydrogen-containing gas supply pipe 232b, an $H_2$ gas supply source 250b, an MFC 252b, and a valve 253b are installed sequentially from the upstream side. On the inert gas supply pipe 232c, an Ar gas supply source 250c, an MFC 252c, and a valve 253c are installed sequentially from the upstream side.

A valve 243a is installed on the downstream side of a merging point where the oxygen-containing gas supply pipe 232a, the hydrogen-containing gas supply pipe 232b and the inert gas supply pipe 232c merge. The merging point is connected to the upstream end of the gas introduction port 234.

A gas supplier 230 (gas supply system) according to the present embodiment is mainly composed of the gas supply head 236 (the lid 233, the gas introduction port 234, the buffer chamber 237, the opening 238, the shielding plate 240 and the gas outlet 239), the oxygen-containing gas supply pipe 232a, the hydrogen-containing gas supply pipe 232b, the inert gas supply pipe 232c, the MFCs 252a, 252b and 252c, and the valves 253a, 253b, 253c and 243a.

[Exhaust 228]

As shown in FIG. 1, an exhaust 228 is installed below the process chamber 201 so as to face the loading/unloading port 245 in the horizontal direction. Specifically, a gas exhaust port 235 for exhausting the reaction gas from the process chamber 201 is installed on the side wall of the lower container 211. The upstream end of a gas exhaust pipe 231 is connected to the gas exhaust port 235. On the gas exhaust pipe 231, an APC (Auto Pressure Controller) 242 as a pressure regulator (pressure regulation part), a valve 243b as an on-off valve, and a vacuum pump 246 as an vacuum exhaust device are installed sequentially from the upstream side.

An exhaust 228 according to the present embodiment is mainly composed of the gas exhaust port 235, the gas exhaust pipe 231, the APC 242, and the valve 243b. The vacuum pump 246 may be included in the exhaust.

[Plasma Generator 216]

As shown in FIG. 1, the plasma generator 216 is mainly installed on the outside of the outer wall of the cylindrical portion 210a of the upper container 210. Specifically, a spiral-shaped resonance coil 212 is installed on the outer peripheral portion of the process chamber 201, i.e., on the outside of the side wall of the upper container 210 so as to surround the process chamber 201. In other words, the spiral-shaped resonance coil 212 is installed so as to surround the process container 203 from the outside (the side away from the center of the cylindrical portion 210a) in a radial direction of the cylindrical portion 210a (hereinafter referred to as "container radial direction"). The resonance coil 212 is an example of an electrode.

Further, an RF sensor 272, a high-frequency power source 273, and a matcher 274 that matches an impedance or an output frequency of the high-frequency power source 273 are connected to the resonance coil 212.

—High-Frequency Power Source 273, RF Sensor 272, Matcher 274—

The high-frequency power source 273 is configured to supply high-frequency power (RF power) to the resonance coil 212. The RF sensor 272 is installed on an output side of the high-frequency power source 273 to monitor the information on a traveling wave or a reflected wave of the supplied high-frequency power. A reflected wave power monitored by the RF sensor 272 is inputted to the matcher 274. The matcher 274 is configured to control the impedance of the high-frequency power source 273 or the frequency of the outputted high-frequency power based on the reflected wave information inputted from the RF sensor 272 so that the reflected wave is minimized.

The high-frequency power source 273 includes a power source controller (control circuit) including a high-frequency oscillation circuit for defining an oscillation frequency and an output and a preamplifier, and an amplifier (output circuit) for amplifying the high-frequency power to a predetermined output. The power source controller controls the amplifier based on the power output conditions regarding the frequency and power set in advance through a control panel. The amplifier supplies a constant high-frequency power to the resonance coil 212 via a transmission line.

—Resonance Coil 212—

In order for the resonance coil 212 to form a standing wave having a predetermined wavelength, a winding diameter, winding pitch, and number of turns are set so that the resonance coil 212 resonates at a constant wavelength. That is, the electrical length of the resonance coil 212 is set to a length corresponding to an integer multiple (1 times, 2 times, or . . . ) of one wavelength of a predetermined frequency of the high-frequency power supplied from the high-frequency power source 273. In other words, the substrate processing apparatus 100 includes a high-frequency power source 273 that supplies high-frequency power having a wavelength, which is an integer multiple of the electrical length of the resonance coil 212, to the electrode.

Specifically, in view of the applied power, the strength of the generated magnetic field, the external shape of the applied apparatus, and the like, the resonance coil 212 is formed to have, for example, an effective cross-sectional area of 50 to 300 mm² so that a magnetic field of about 0.01 to 10 gauss can be generated by high-frequency power of 800 kHz to 50 MHz and 0.5 to 5 kW. Further, for example, the resonance coil 212 may be wound around the outer peripheral side of the chamber forming the plasma generation space 201a (see FIG. 2) about 2 to 60 turns with a coil diameter of 200 to 500 mm.

As a preferred example, the frequency is set to, for example, 13.56 MHz or 27.12 MHz. In the present embodiment, the frequency of the high-frequency power is set to 27.12 MHz, and the electrical length of the resonance coil 212 is set to a length of one wavelength (about 11 meters). The winding pitch of the resonance coil 212 is set to, for example, equal intervals of 24.5 mm. Further, the winding diameter of the resonance coil 212 is set to be larger than the diameter of the wafer 200. In the present embodiment, the diameter of the wafer 200 is set to 300 mm, and the winding diameter of the resonance coil 212 is set to 500 mm, which is larger than the diameter of the wafer 200.

As the material constituting the resonance coil 212, a copper pipe, a thin copper plate, an aluminum pipe, a thin aluminum plate, a material obtained by vapor-depositing copper or aluminum on a polymer belt, or the like is used.

Both ends of the resonance coil 212 are electrically grounded, and at least one end is grounded through a movable tap 213 to finely tune the electrical length of the resonance coil during the initial installation of the apparatus or during the change in processing conditions. Reference numeral 214 in FIG. 1 indicates the other fixed ground. Further, in order to finely tune the impedance of the resonance coil 212 during the initial installation of the apparatus or during the change in processing conditions, a power supplier is configured by the movable tap 215 between the grounded ends of the resonance coil 212.

—Shielding Plate 224—

The shielding plate 224 is configured to cover the resonance coil 212 from the outside of a container radial direction and to shield the electric field generated by the resonance coil 212, and is installed to form a capacitance component (C component) necessary for constituting a resonance circuit between the shielding plate 224 and the resonance coil 212. The shielding plate 224 is an example of a shield.

Specifically, the shielding plate 224 is formed by using a conductive material such as an aluminum alloy or the like. The shielding plate 224 includes a cylindrical main body portion 225 that covers the resonance coil 212 from the outside of the container radial direction and an upper flange 226 connected to an upper end of the main body portion 225 and extending toward the inside of the container radial direction. Further, the shielding plate 224 includes a lower flange 227 connected to the lower end of the main body portion 225 and extending toward the inside of the container radial direction.

The resonance coil 212 described above is supported by a plurality of supports 229 vertically erected on the upper end surface of the lower flange 227. Further, a support plate 256 placed on the base plate 248 and having a through-hole through which the upper container 210 passes is installed, and the shielding plate 224 is supported from below by the support plate 256. In other words, the support plate 256 supports the shielding plate 224 and the resonance coil 212 from below. The support plate 256 is an example of a support part.

The shielding plate 224 is arranged at a distance of about 5 to 150 mm from the outer circumference of the resonance coil 212.

A plasma generator 216 according to the present embodiment is mainly composed of the resonance coil 212, the RF sensor 272, and the matcher 274. The high-frequency power source 273 may be included as the plasma generator.

Herein, the plasma generation principle of the apparatus according to the present embodiment and the properties of the generated plasma is described with reference to FIG. 2.

The plasma generation circuit composed by the resonance coil 212 is composed of a parallel resonance circuit (RLC). However, in the plasma generation circuit, when plasma is generated, an actual resonance frequency of the resonance coil 212 fluctuates slightly depending on the fluctuation in the capacitive coupling between the voltage portion of the resonance coil 212 and the plasma, the fluctuation in the inductive coupling between the plasma generation space 201*a* and the plasma, the plasma excitation state, and the like.

Therefore, in the present embodiment, in order to compensate for the deviation of the resonance in the resonance coil 212 at the time of plasma generation from a power source side, the matcher 274 increases or decreases the impedance or the output frequency of the high-frequency power source 273, based on the reflected wave power from the resonance coil 212 when the generation of the plasma is detected by the RF sensor 272, so that the reflected wave power is minimized.

With this configuration, in the resonance coil 212 of the present embodiment, as shown in FIG. 2, the high-frequency power according to the actual resonance frequency of the resonance coil containing plasma is supplied (or the high-frequency power is supplied to match an actual impedance of the resonance coil containing the plasma) so that a standing wave is formed in which the phase voltage and the antiphase voltage are always offset. When the electrical length of the resonance coil 212 is the same as the wavelength of the high-frequency power, a highest phase current is generated at the electrical midpoint of the coil (the node with a zero voltage). Accordingly, in the vicinity of the electrical midpoint, there is almost no capacitive coupling with the process chamber wall or the susceptor 217, and donut-shaped inductive plasma having an extremely low electrical potential is formed.

[Mover 310]

The mover 310 is configured to move the resonance coil 212 with respect to the process container 203. First, the purpose of moving the resonance coil 212 with respect to the process container 203 will be described.

The plasma distribution in the process chamber 201 may not be a desired distribution due to reasons such as the variations in the position of the resonance coil 212, the variations in the shape of the process container 203, the variations in the strength of the electromagnetic field generated from the resonance coil 212, and the differences in the processing conditions for processing the wafer 200. Specifically, the plasma distribution in the process chamber 201 may not be uniform along the circumferential direction of the process container 203. That is, the film formed on the wafer 200 may not be uniformly oxidized.

In such a case, by changing the position of the resonance coil 212 with respect to the process container 203, the distance between the resonance coil 212 and the process container 203 (hereinafter also referred to as "coil-container distance") can be changed in the circumferential direction of the process container 203. By making the coil-container distance different in the circumferential direction of the process container 203, the plasma distribution in the process container 203 can be changed so that the plasma distribution becomes uniform along the circumferential direction of the process container 203.

Figure 4:
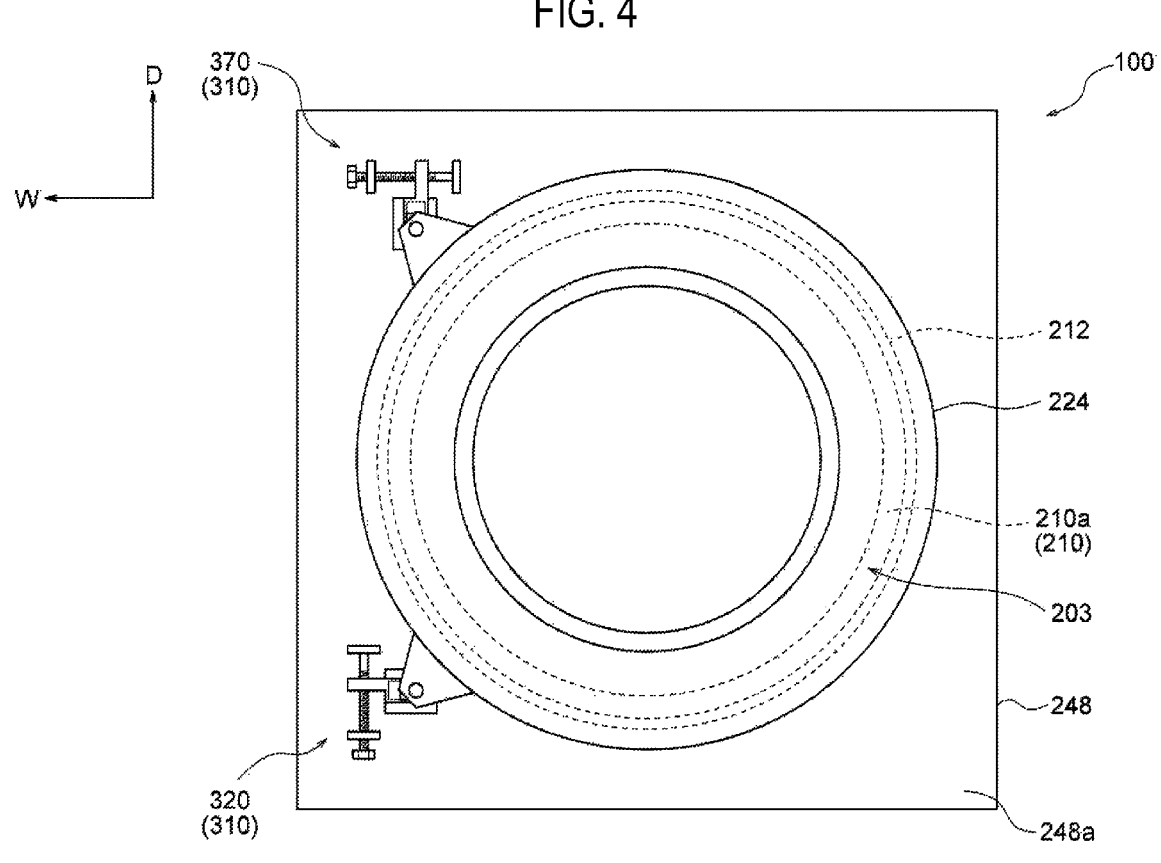
FIG. 4 is a plan view showing a mover, a shielding plate, and the like of the substrate processing apparatus according to the first embodiment of the present disclosure.

As shown in FIG. 4, the mover 310 for moving the resonance coil 212 with respect to the process container 203 is installed on an upper surface 248*a* of the base plate 248, and is composed of a first mover 320 and a second mover 370.

The first mover 320 is configured to move the resonance coil 212 and the shielding plate 224 in the apparatus depth direction which is a container radial direction, and the second mover 370 is configured to move the resonance coil 212 and the shielding plate 224 in the apparatus width direction orthogonal to the apparatus depth direction, where the apparatus width direction is a container radial direction.

The apparatus depth direction is an example of one direction, and the apparatus width direction is an example of another direction.

—First Mover 320—

Figure 5:
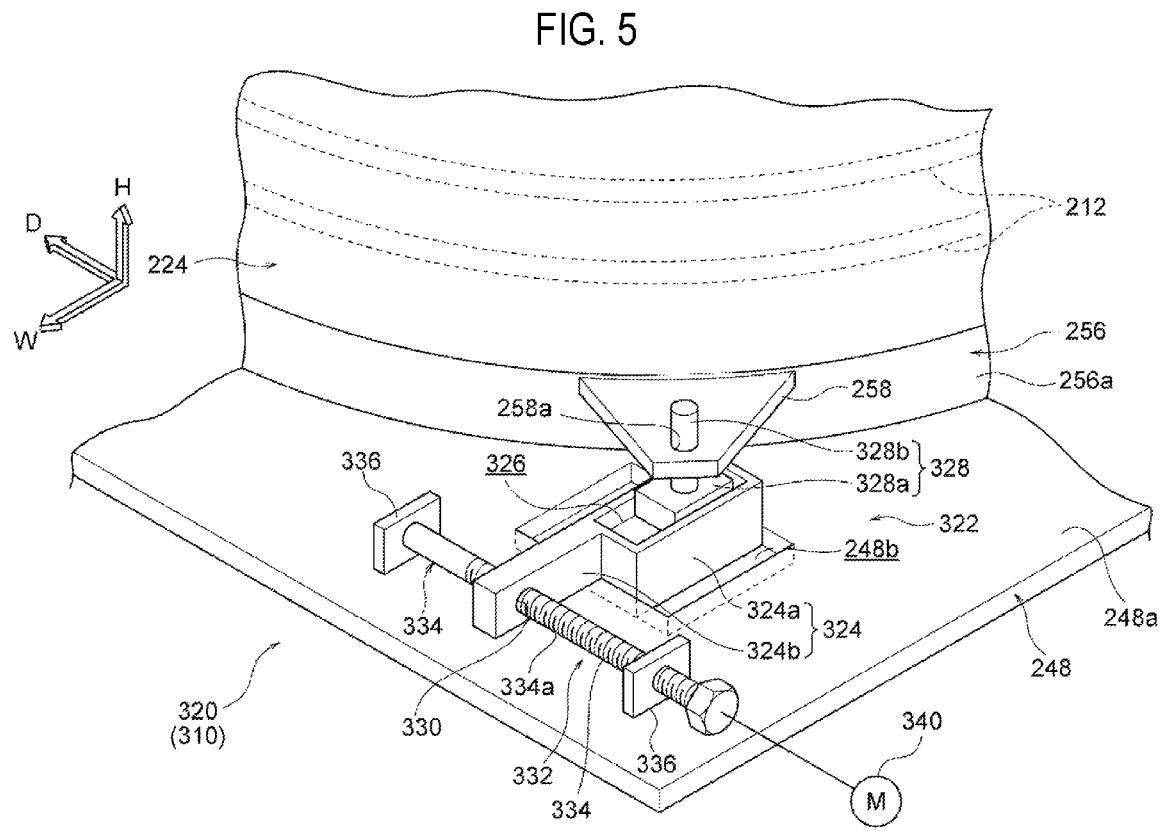
FIG. 5 is a perspective view showing the mover of the substrate processing apparatus according to the first embodiment of the present disclosure.

As shown in FIG. 4, the first mover 320 is arranged in the base plate 248 on a front side (lower side of the paper surface) in the apparatus depth direction and on one side (left side of the paper surface) in the apparatus width direction. As shown in FIG. 5, the first mover 320 includes a movable part 322 indirectly attached to the resonance coil 212 and configured to move integrally with the resonance coil 212, an adjuster 332 which is a mechanism for, when operated, adjusting the position of the movable part 322 by moving the movable part 322, and a driver 340 which is a stepping motor. As used herein, the expression "move integrally" means moving with no change in relative relationship.

—Movable Part 322 of First Mover 320—

The movable part 322 includes a main body portion 324 and a support portion 328 supported by the main body portion 324.

The main body portion 324 includes a rectangular parallelepiped base portion 324*a* extending in the apparatus width direction and a plate-shaped extension portion 324*b* extending from the base portion 324*a* to one side in the apparatus width direction. The lower end portion of the base portion 324*a* is inserted into a guide groove 248*b* formed on the upper surface 248*a* of the base plate 248. As a result, the main body portion 324 is guided by the guide groove 248*b* to move in the apparatus depth direction. In addition, a guide groove 326 extending in the apparatus width direction is formed on the upper surface of the base portion 324*a*.

Further, the extension portion 324*b* has a plate thickness direction extending in the apparatus depth direction and has a rectangular shape extending in the apparatus width direction when viewed from the apparatus depth direction. A female thread 330 extending in the apparatus depth direction is formed in the extension portion 324*b*.

Further, the support portion 328 includes a rectangular parallelepiped base portion 328*a* extending in the apparatus width direction, and a cylindrical portion 328*b* protruding upward from the base portion 328*a*. A portion of the base portion 328*a* excluding the upper end portion is inserted into the guide groove 326 formed on the upper surface of the base portion 324*a* of the main body portion 324. As a result, the support portion 328 is guided by the guide groove 326 to move in the apparatus width direction.

Further, a protrusion 258 protruding from the outer circumferential surface 256*a* and having the vertical direction as a plate thickness direction is formed at the support plate 256. Further, a through-hole 258*a* penetrating in the vertical direction is formed in the protrusion 258. The cylindrical portion 328*b* of the support portion 328 is inserted into the through-hole 258*a*.

—Adjuster 332 of First Mover 320—

The adjuster 332 includes a threaded shaft 334 extending in the apparatus depth direction, and a pair of support plates 336 that rotatably support the threaded shaft 334.

A male thread 334*a* is formed on the outer circumferential surface of the threaded shaft 334. The male thread 334*a* of the threaded shaft 334 is tightened to the female thread 330 of the main body portion 324. A known ball screw structure including the threaded shaft 334, the female thread 330, the balls (not shown), and the like is formed. Further, a driver 340 is installed so as to rotate the threaded shaft 334.

In this configuration, when the driver 340 rotates the threaded shaft 334 in one direction, the first mover 320 moves the resonance coil 212 and the shielding plate 224 to the back side in the apparatus depth direction with respect to the process container 203. Specifically, when the driver 340 rotates the threaded shaft 334 in one direction, the main body portion 324 and the support portion 328 are moved to the back side in the apparatus depth direction. Further, when the main body portion 324 and the support portion 328 are moved to the back side in the apparatus depth direction, the resonance coil 212 and the shielding plate 224 are moved to the back side in the apparatus depth direction via the support plate 256.

On the other hand, when the driver 340 rotates the threaded shaft 334 in the other direction, the first mover 320 moves the resonance coil 212 and the shielding plate 224 toward the front side in the apparatus depth direction with respect to the process container 203. Specifically, when the driver 340 rotates the threaded shaft 334 in the other direction, the main body portion 324 and the support portion 328 are moved toward the front side in the apparatus depth direction. Further, when the main body portion 324 and the support portion 328 are moved toward the front side in the apparatus depth direction, the resonance coil 212 and the shielding plate 224 are moved toward the front side in the apparatus depth direction via the support plate 256. In this way, the resonance coil 212 and the shielding plate 224 are moved integrally.

Even when the resonance coil 212 and the shielding plate 224 are moved in the apparatus width direction by the second mover 370, the support portion 328 is guided by the guide groove 326 to move in the apparatus width direction, whereby the movement of the resonance coil 212 and the shielding plate 224 by the second mover 370 can be absorbed.

—Second Mover 370—

As shown in FIG. 4, the second mover 370 is arranged in the base plate 248 on a back side (upper side of the paper surface) in the apparatus depth direction and on one side (left side of the paper surface) in the apparatus width direction.

Figure 6:
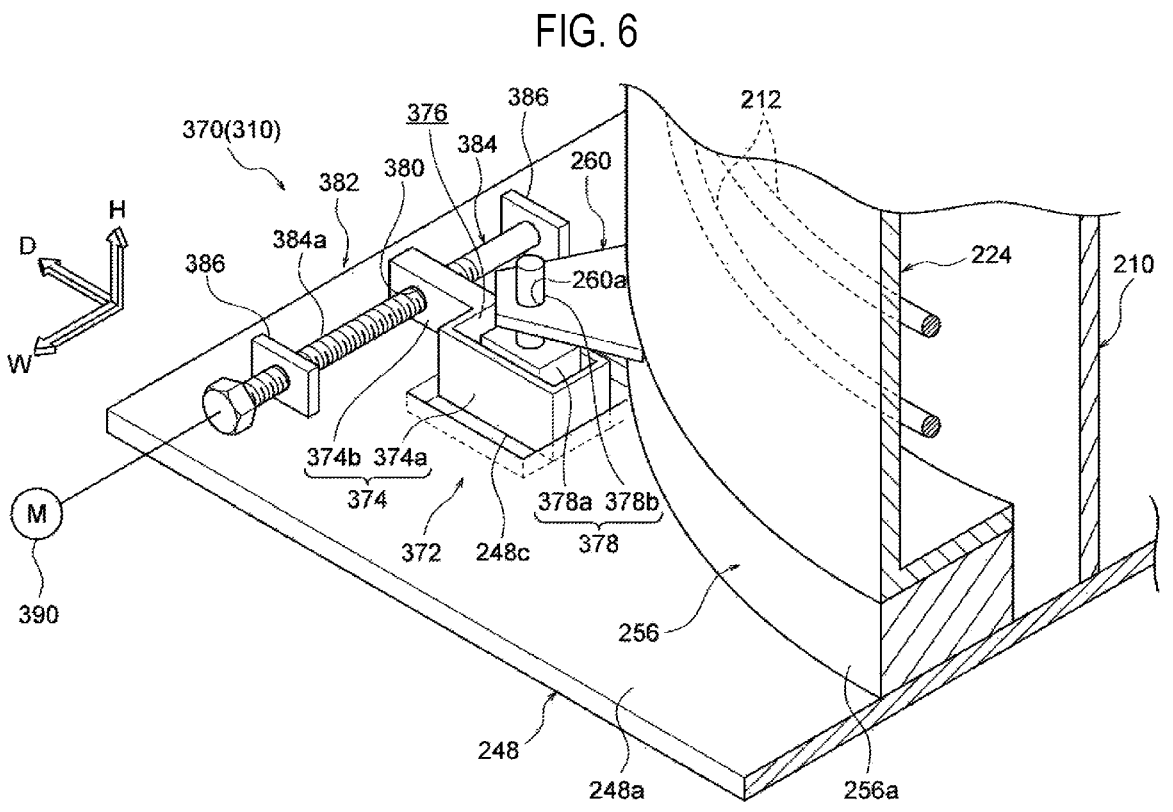
FIG. 6 is a perspective view showing the mover of the substrate processing apparatus according to the first embodiment of the present disclosure.

As shown in FIG. 6, the second mover 370 includes a movable part 372 indirectly attached to the resonance coil 212 and configured to move integrally with the resonance coil 212, an adjuster 382 which is a mechanism for, when operated, adjusting the position of the movable part 372 by moving the movable part 372, and a driver 390 which is a stepping motor.

—Movable Part 372 of Second Mover 370—

The movable part 372 includes a main body portion 374 and a support portion 378 supported by the main body portion 374.

The main body portion 374 includes a rectangular parallelepiped base portion 374a extending in the apparatus depth direction and a plate-shaped extension portion 374b extending from the base portion 374a to the back side in the apparatus depth direction. The lower end portion of the base portion 374a is inserted into the guide groove 248c formed on the upper surface 248a of the base plate 248. As a result, the main body portion 374 is guided by the guide groove 248c to move in the apparatus width direction. In addition, a guide groove 376 extending in the apparatus depth direction is formed on the upper surface of the base portion 374a.

Further, the extension portion 374b has a plate thickness direction extending in the apparatus width direction and has a rectangular shape extending in the apparatus depth direction when viewed from the apparatus width direction. A female thread 380 extending in the apparatus width direction is formed in the extension portion 374b.

The support portion 378 includes a rectangular parallelepiped base portion 378a extending in the apparatus depth direction, and a cylindrical portion 378b protruding upward from the base portion 378a. A portion of the base portion 378a excluding the upper end portion is inserted into the guide groove 376 formed on the upper surface of the base portion 374a of the main body portion 374. As a result, the support portion 378 is guided by the guide groove 376 to move in the apparatus depth direction.

Further, a protrusion 260 protruding from the outer circumferential surface 256a and having the vertical direction as a plate thickness direction is formed at the support plate 256. In addition, a through-hole 260a penetrating in the vertical direction is formed in the protrusion 260. The cylindrical portion 378b of the support portion 378 is inserted into the through-hole 260a.

—Adjuster 382 of Second Mover 370—

The adjuster 382 includes a threaded shaft 384 extending in the apparatus width direction, and a pair of support plates 386 that rotatably support the threaded shaft 384.

A male thread 384a is formed on the outer circumferential surface of the threaded shaft 384. The male thread 384a of the threaded shaft 384 is threadedly coupled to the female thread 380 of the main body portion 374. A known ball screw structure including the threaded shaft 384, the female thread 380, the balls (not shown), and the like is formed. In addition, a driver 390 is installed so as to rotate the threaded shaft 384.

In this configuration, when the driver 390 rotates the threaded shaft 384 in one direction, the second mover 370 moves the resonance coil 212 and the shielding plate 224 to one side in the apparatus width direction with respect to the process container 203. Specifically, when the driver 390 rotates the threaded shaft 384 in one direction, the main body portion 374 and the support portion 378 are moved to one side in the apparatus width direction. Further, when the main body portion 374 and the support portion 378 are moved to one side in the apparatus width direction, the resonance coil 212 and the shielding plate 224 are moved to one side in the apparatus width direction via the support plate 256.

On the other hand, when the driver 390 rotates the threaded shaft 384 in the other direction, the second mover 370 moves the resonance coil 212 and the shielding plate 224 to the other side in the apparatus width direction with respect to the process container 203. Specifically, when the driver 390 rotates the threaded shaft 384 in the other direction, the main body portion 374 and the support portion 378 are moved to the other side in the apparatus width direction. Further, when the main body portion 374 and the support portion 378 are moved to the other side in the apparatus width direction, the resonance coil 212 and the shielding plate 224 are moved to the other side in the apparatus width direction via the support plate 256.

[Controller 221]

As shown in FIG. 1, the controller 221 is configured to control the APC 242, the valve 243b and the vacuum pump 246 through a signal line A, control the susceptor elevator 268 through a signal line B, control the heater power adjuster 276 through a signal line C, control the gate valve 244 through a signal line D, control the RF sensor 272, the high-frequency power source 273 and the matcher 274 through a signal line E, and control the MFCs 252a to 252c and the valves 253a to 253c and 243a through a signal line F.

Figure 3:
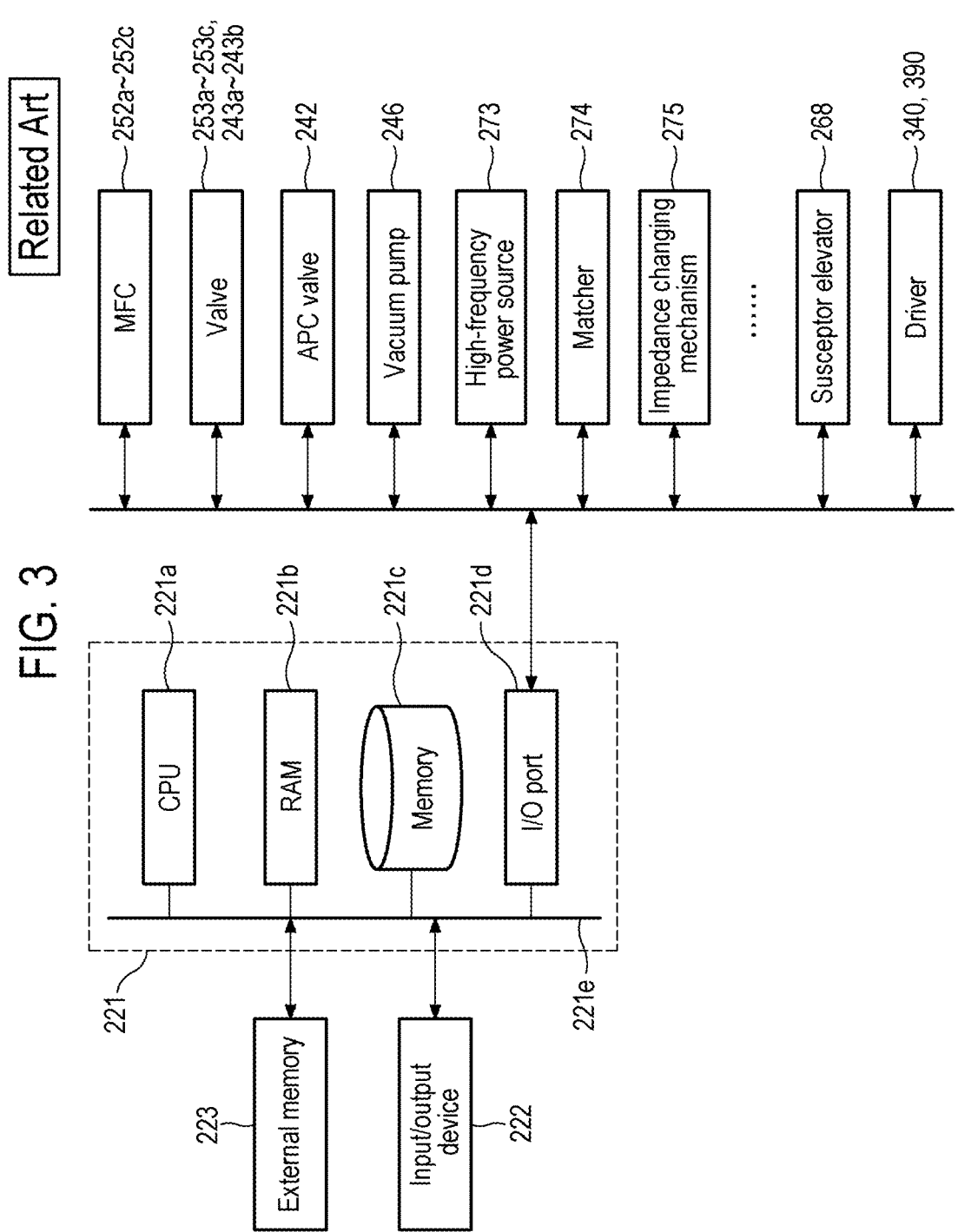
FIG. 3 is a control block diagram showing a control system of a controller of the substrate processing apparatus according to the first embodiment of the present disclosure.

As shown in FIG. 3, the controller 221 is configured as a computer including a CPU (Central Processing Unit) 221a, a RAM (Random Access Memory) 221b, a memory 221c, and an I/O port 221d. The RAM 221b, the memory 221c, and the I/O port 221d are configured to exchange data with the CPU 221a via an internal bus 221e. An input/output device 222 configured as, for example, a touch panel or a display is connected to the controller 221. The input/output device 222 is an example of an input part and a display part.

In this regard, an operation command and processing conditions as movement information for moving the resonance coil 212 are inputted to the input/output device 222. Further, the input/output device 222 displays an amount of movement of the resonance coil 212 with respect to a predetermined reference position. The processing conditions inputted to the input/output device 222 and the displayed amount of movement of the resonance coil 212 will be described with the operations described later.

—Memory 221c—

The memory 221c is composed of, for example, a flash memory, an HDD (Hard Disk Drive), or the like. The memory 221c readably stores a control program for controlling the operation of the substrate processing apparatus, a program recipe in which the procedure and conditions for substrate processing described later are written, and the like. The memory 221c is an example of a memory.

The process recipe is configured to cause the CPU 221a to execute each procedure in the below-described substrate processing process to obtain a predetermined result. The process recipe functions as a program. Hereinafter, the program recipe, the control program, etc. are collectively and simply referred to as a program. When the term program is used in the subject specification, it may include only the program recipe, only the control program, or both of them. Further, the RAM 221b is configured as a memory area (work area) in which programs, data, and the like read by the CPU 221a are temporarily held.

In the present embodiment, the memory 221c stores a plurality of processing conditions as movement information for moving the resonance coil 212 and positions of the resonance coil 212 with respect to the process container 203 corresponding to the respective processing conditions. In the present embodiment, the processing conditions include at least one selected from the group of the temperature of the wafer 200 to be processed, the pressure in the process chamber 201, the type of the processing gas for processing the wafer 200, the flow rate of the processing gas for processing the wafer 200, and the electric power supplied to the resonance coil 212.

The position of the resonance coil 212 with respect to the process container 203 is derived as follows, and is stored in the memory 221c. First, the plasma distribution is confirmed by changing the position of the resonance coil 212 with respect to the process container 203 to a plurality of positions for the respective process conditions. Then, for each processing condition, the position of the resonance coil 212 with respect to the process container 203, which can be made uniform along the circumferential direction of the process container 203 in the process container 203, is derived and stored in the memory 221c.

—I/O Port 221d—

The I/O port 221d is connected to the MFCs 252a to 252c, the valves 253a to 253c, 243a and 243b, the gate valve 244, the APC 242, the vacuum pump 246, the RF sensor 272, the high-frequency power source 273, the matcher 274, the susceptor elevator 268, the heater power adjuster 276, the drivers 340 and 390, and the like.

—CPU 221a—

The CPU 221a is configured to read the control program from the memory 221c and execute the same, and is configured to read the process recipe from the memory 221c in response to an input of an operation command from the input/output device 222 or the like. The CPU 221a is an example of the controller.

Then, the CPU 221a is configured to control, according to the contents of the process recipe thus read, the opening degree adjustment operation of the APC 242, the opening/closing operation of the valve 243b and the start/stop of the vacuum pump 246 through the I/O port 221d and the signal line A, the raising/lowering operation of the susceptor elevator 268 through the signal line B, the adjustment operation of the amount of electric power supplied to the heater 217b by the heater power adjuster 276 (the temperature adjustment operation) through the signal line C, the opening/closing operation of the gate valve 244 through the signal line D, the operations of the RF sensor 272, the matcher 274 and the high-frequency power source 273 through the signal line E, the flow rate adjustment operations of various gases by the MFCs 252a to 252c and the opening/closing operations of the valves 253a to 253c and 243a through the signal line F, and the like.

The controller 221 may be configured by installing, in the computer, the above-mentioned program stored in an external memory (e.g., a magnetic tape, a magnetic disk such as a flexible disk or a hard disk, an optical disk such as a CD or a DVD, an optical magnetic disk such as an MO or the like, or a semiconductor memory such as a USB memory or a memory card) 223. The memory 221c and the external memory 223 are configured as a computer-readable recording medium. Hereinafter, these are collectively and simply referred to as a recording medium. In the subject specification, when the term recording medium is used, it may include only the memory 221c, only the external memory 223, or both of them. The program may be provided to the computer by using a communication means such as the Internet or a dedicated line without using the external memory 223.

(Action)

Next, a method of manufacturing a semiconductor device using the substrate processing apparatus 100 will be described with reference to the flow chart shown in FIG. 7.

The method for manufacturing a semiconductor device according to the present embodiment is one of processes of manufacturing a semiconductor device such as a flash memory or the like and is carried out by the above-described substrate processing apparatus 100. In the following description, the operation of each part constituting the substrate processing apparatus 100 is controlled by the CPU 221a.

On the surface of the wafer 200 to be processed in the substrate processing process according to the present embodiment, for example, a trench having at least a surface made of a layer of silicon and having an uneven portion with a high aspect ratio is formed in advance. In the present embodiment, the silicon layer exposed on an inner wall of the trench is subjected to an oxidation process as a process using plasma.

In the state before the substrate processing apparatus 100 is operated, the resonance coil 212 is arranged at a predetermined reference position.

[Substrate Loading Step S100]

In the substrate loading step S100, the wafer 200 is loaded into the process chamber 201. Specifically, the susceptor elevator 268 shown in FIG. 1 lowers the susceptor 217 to the wafer transfer position, and causes the wafer push-up pins 266 to penetrate through the through-holes 217a of the susceptor 217.

Subsequently, the gate valve 244 is opened, and the wafer 200 is loaded from the vacuum transfer chamber adjacent to the process chamber 201 into the process chamber 201 using a wafer transfer mechanism (not shown). The loaded wafer 200 is supported in a horizontal posture on the wafer push-up pins 266 protruding from the surface of the susceptor 217. After the wafer 200 is loaded into the process chamber 201, the wafer transfer mechanism is retracted to the outside of the process chamber 201, and the gate valve 244 is closed to seal the process chamber 201. Then, the susceptor elevator 268 raises the susceptor 217, so that the wafer 200 is supported on the upper surface of the susceptor 217.

[Position Adjustment Step S200]

In the position adjustment step S200, based on the movement information of the resonance coil 212 inputted to the input/output device 222 by the operator, the first mover 320 moves the resonance coil 212 in the apparatus depth direction, and the second mover 370 moves the resonance coil 212 in the apparatus width direction.

Specifically, first, the operator inputs the processing conditions as the movement information of the resonance coil 212 to the input/output device 222. In the present embodiment, the processing conditions includes at least one selected from the group of the temperature of the wafer 200 to be processed, the pressure in the process chamber 201, the type of the processing gas for processing the wafer 200, the flow rate of the processing gas for processing the wafer 200, and the electric power supplied to the resonance coil 212. Then, the driver 340 and the driver 390 are operated based on the position of the resonance coil 212 with respect to the process container 203 corresponding to each processing condition stored in the memory 221c.

The driver 340 rotates the threaded shaft 334. As the threaded shaft 334 is rotated, the main body portion 324 and the support portion 328 move in the apparatus depth direction. Further, when the main body portion 324 and the support portion 328 are moved in the apparatus depth direction, the resonance coil 212 and the shielding plate 224 move in the apparatus depth direction via the support plate 256. Since the support portion 328 is guided by the guide groove 326 to move in the apparatus width direction, the position of the resonance coil 212 in the apparatus width direction is not restricted by the driver 340 that operates.

Further, the driver 390 rotates the threaded shaft 384. As the threaded shaft 384 is rotated, the main body portion 374 and the support portion 378 move in the apparatus width direction. Further, when the main body portion 374 and the support portion 378 are moved in the apparatus width direction, the resonance coil 212 and the shielding plate 224 move in the apparatus width direction via the support plate 256. Since the support portion 378 is guided by the guide groove 376 to move in the apparatus depth direction, the position of the resonance coil 212 in the apparatus depth direction is not restricted by the operating driver 390.

As described above, the resonance coil 212 and the shielding plate 224 are moved based on the position of the resonance coil 212 with respect to the process container 203 corresponding to each processing condition. Then, while the wafer 200 is being processed in the process chamber 201, the drivers 340 and 390 are kept in a non-operating state. In other words, while the wafer 200 is being processed in the process chamber 201, the relative relationship between the resonance coil 212 and the process container 203 is maintained.

As another embodiment, the operator may directly input the amount of movement of the resonance coil 212 with respect to the reference position (or the position information of the resonance coil 212 with respect to the process container 203 after the resonance coil 212 moved) as the movement information from the input/output device 222. The driver 340 and the driver 390 may be operated based on the inputted movement information.

[Temperature Raising/Vacuum Exhaust Step S300]

In the temperature raising/vacuum exhaust step S300, the temperature of the wafer 200 loaded into the process chamber 201 is raised. The heater 217b shown in FIG. 1 is preheated, and the wafer 200 is heated by allowing the wafer 200 to be held on the susceptor 217 in which the heater 217b is embedded. In this case, the wafer 200 is heated so as to have a temperature of 600 degrees C. Further, while the temperature of the wafer 200 is being raised, the process chamber 201 is vacuum-exhausted through the gas exhaust pipe 231 by the vacuum pump 246 to set the pressure in the process chamber 201 to a predetermined value. The vacuum pump 246 is operated at least until the substrate unloading step S700, which will be described later, is completed.

[Reaction Gas Supply Step S400]

In the reaction gas supply step S400, an $O_2$ gas, which is an oxygen-containing gas, and an $H_2$ gas, which is a hydrogen-containing gas, is supplied as reaction gases. Specifically, the valves 253a and 253b shown in FIG. 1 are opened, and the supply of the $O_2$ gas and the $H_2$ gas to the process chamber 201 is started while the flow rates of the gases are controlled by the MFCs 252a and 252b. At this time, the flow rate of the $O_2$ gas is set to a predetermined value in the range of, for example, 20 to 2000 sccm. In addition, the flow rate of the $H_2$ gas is set to a predetermined value in the range of, for example, 20 to 1000 sccm.

Further, the opening degree of the APC 242 is adjusted to control the exhaust of the process chamber 201 so that the pressure in the process chamber 201 is set to a predetermined pressure in the range of, for example, 1 to 250 Pa. In this way, while appropriately exhausting the process chamber 201, the supply of the $O_2$ gas and the $H_2$ gas is continued until the end of the plasma processing step S500, which will be described later.

[Plasma Processing Step S500]

After the pressure in the process chamber 201 stabilizes, in the plasma processing step S500, the supply of the high-frequency power is started from the high-frequency power source 273 to the resonance coil 212 shown in FIG. 1 via the RF sensor 272. In the present embodiment, the high-frequency power source 273 supplies the high-frequency power of 27.12 MHz to the resonance coil 212. The high-frequency power supplied to the resonance coil 212 is, for example, a predetermined power in the range of 100 to 5000 W.

As a result, a high-frequency electric field is formed in the plasma generation space 201a (see FIG. 2) to which the $O_2$ gas and the $H_2$ gas are supplied. By this electric field, a donut-shaped inductive plasma having a highest plasma density is excited at a height position corresponding to the electrical midpoint of the resonance coil 212 in the plasma generation space 201a. Plasma-like $O_2$ gas and $H_2$ gas are dissociated to generate reactive species such as oxygen radicals (oxygen active species) or oxygen ions containing oxygen, hydrogen radicals (hydrogen active species) or hydrogen ions containing hydrogen, or the like.

As described above, in the position adjustment step S200, the resonance coil 212 is arranged at the position corresponding to the inputted processing conditions. Thus, the plasma distribution in the process chamber 201 can be made uniform along the circumferential direction of the process container 203.

Then, the radicals and ions generated by inductive plasma are supplied into the trench on the surface of the wafer 200 which is held on the susceptor 217 in the substrate processing space 201b (see FIG. 2). The supplied radicals and ions react with the side wall of the trench to modify the silicon layer on the surface into a silicon oxide layer.

Thereafter, when a predetermined processing time, for example, 10 to 300 seconds has elapsed, the supply of the electric power from the high-frequency power source 273 is stopped to stop the plasma discharge in the process chamber 201. Further, the valves 253a and 253b are closed to stop the supply of the $O_2$ gas and the $H_2$ gas to the process chamber 201. As a result, the plasma processing step S500 is completed.

[Vacuum Exhaust Step S600]

After stopping the supply of the $O_2$ gas and the $H_2$ gas, in the vacuum exhaust step S600, the inside of the process chamber 201 is vacuum-exhausted through the gas exhaust pipe 231 shown in FIG. 1. As a result, the $O_2$ gas and $H_2$ gas, the exhaust gas generated by the reaction of these gases, and the like in the process chamber 201 are exhausted to the outside of the process chamber 201. Thereafter, the opening degree of the APC 242 is adjusted to adjust the pressure in the process chamber 201 to the same pressure as the pressure in the vacuum transfer chamber (an unloading destination of the wafer 200, not shown) adjacent to the process chamber 201.

[Substrate Unloading Step S700]

After the pressure in the process chamber 201 reaches a predetermined pressure, in the substrate unloading step S700, the susceptor 217 shown in FIG. 1 is lowered to the wafer transfer position, so that the wafer 200 is supported on the wafer push-up pins 266. Then, the gate valve 244 is opened, and the wafer 200 is unloaded from the process chamber 201 by using the wafer transfer mechanism. Further, the drivers 340 and 390 are operated to move the resonance coil 212 to the reference position. As described above, the substrate processing process according to the present embodiment is completed.

(Summary)

As described above, according to the substrate processing apparatus 100, in the position adjustment step S200, the driver 340 and 390 are operated to move the resonance coil 212 with respect to the process container 203. As a result, the plasma distribution (plasma density distribution) in the process chamber 201 can be made uniform along the circumferential direction of the process container 203. In other words, by moving the resonance coil 212 with respect to the process container 203, the plasma distribution in the process chamber 201 can be made into a desired distribution.

Further, according to the substrate processing apparatus 100, in the position adjustment step S200, the first mover 320 of the mover 310 moves the resonance coil 212 with respect to the process container 203 in the apparatus depth direction. The second mover 370 of the mover 310 moves the resonance coil 212 with respect to the process container 203 in the apparatus width direction. As a result, the movement range of the resonance coil 212 can be widened as compared with the case where the resonance coil is movable only in one direction.

Further, according to the substrate processing apparatus 100, the first mover 320 includes the movable part 322 indirectly attached to the resonance coil 212 and configured to move integrally with the resonance coil 212, and an adjuster 332 which is a mechanism for adjusting the position of the movable part 322 by moving the movable part 322. Further, the second mover 370 includes the movable part 372 indirectly attached to the resonance coil 212 and configured to move integrally with the resonance coil 212, and an adjuster 382 which is a mechanism for adjusting the position of the movable part 372 by moving the movable part 372. By providing the movable parts 322 and 372 and the adjusters 332 and 382 in this way, the resonance coil 212 can be moved to a desired position with high accuracy.

Further, according to the substrate processing apparatus 100, the first mover 320 includes a driver 340 configured to rotate the threaded shaft 334 of the adjuster 332, and the second mover 370 includes a driver 390 configured to rotate the threaded shaft 384 of the adjuster 382. As a result, the resonance coil 212 can be moved with respect to the process container 203 without manually turning the threaded shafts 334 and 384.

Further, according to the substrate processing apparatus 100, the substrate processing apparatus 100 includes an input/output device 222 configured to input movement information for moving the resonance coil 212, and a CPU 221a configured to control the drivers 340 and 390 and rotate the threaded shafts 334 and 384 of the adjusters 332 and 382 based on the movement information inputted through the input/output device 222. Therefore, for example, the resonance coil 212 may be moved with respect to the process container 203 by inputting the amount of movement by the operator.

Further, the substrate processing apparatus 100 includes a memory 221c configured to store the processing conditions as movement information and the relative positions of the resonance coil 212 with respect to the process container 203 corresponding to the respective processing conditions, and the CPU 221a controls the drivers 340 and 390 based on the processing conditions as the movement information inputted through the input/output device 222 and the relative positions of the resonance coil 212 with respect to the process container 203 corresponding to the respective processing conditions stored in the memory 221c. In this case, the generated plasma distribution or the plasma distribution obtained for each processing condition varies depending on the processing conditions. Therefore, by storing the relative positions of the resonance coil 212 with respect to the process container 203 for the respective processing conditions, the plasma distribution in the process chamber 201 can be made a desired distribution for each processing condition.

Further, according to the substrate processing apparatus 100, the processing conditions for processing the wafer 200, which are inputted through the input/output device 222, include at least one selected from the group of the temperature of the wafer 200 to be processed, the pressure in the process chamber 201, the type of the processing gas for processing the wafer 200, the flow rate of the processing gas for processing the wafer 200, and the electric power supplied to the resonance coil 212. Since the generated plasma distribution varies depending on such processing conditions, the plasma distribution in the process chamber 201 can be made into a desired distribution by storing the positions of the resonance coil 212 with respect to the process container 203 for the respective processing conditions.

Further, according to the substrate processing apparatus 100, the drivers 340 and 390 are kept in a non-operating state while the wafer 200 is being processed in the process chamber 201. In other words, while the wafer 200 is being processed in the process chamber 201, the relative relationship between the resonance coil 212 and the process container 203 is maintained. Thus, the plasma distribution in the process chamber 201 can be stabilized.

Further, according to the substrate processing apparatus 100, the resonance coil 212 and the shielding plate 224 are configured to move integrally. In other words, the relative position between the resonance coil 212 and the shielding plate 224 does not change. Therefore, it is possible to suppress the disturbance of the plasma distribution generated by the resonance coil 212, which may occur due to the change in the position of the shielding plate.

Further, according to the substrate processing apparatus 100, a support plate 256 configured to support the shielding plate 224 and the resonance coil 212 from below is installed, and the shielding plate 224 and the resonance coil 212 are moved by moving the support plate 256. In this way, the shielding plate 224 and the resonance coil 212 can be moved by merely moving the support plate 256.

Further, according to the substrate processing apparatus 100, the input/output device 222 is configured to display the amount of movement of the resonance coil 212 with respect to the reference position. Therefore, the operator can visually confirm the amount of movement of the resonance coil 212 with respect to the reference position. For example, the operator can manually fine-tune the position of the resonance coil 212 based on this amount of movement.

Further, according to the method of manufacturing a semiconductor device, in the position adjustment step S200, the drivers 340 and 390 are operated to move the resonance coil 212 with respect to the process container 203. As a result, the plasma distribution in the process chamber 201 can be made uniform along the circumferential direction of the process container 203. In other words, by moving the resonance coil 212 with respect to the process container 203, the plasma distribution in the process chamber 201 can be made into a desired distribution.

Second Embodiment

An example of a second embodiment of the present disclosure will be described with reference to FIGS. 8 to 10. In addition, the parts of the second embodiment different from those of the first embodiment will be mainly described.

Figure 8:
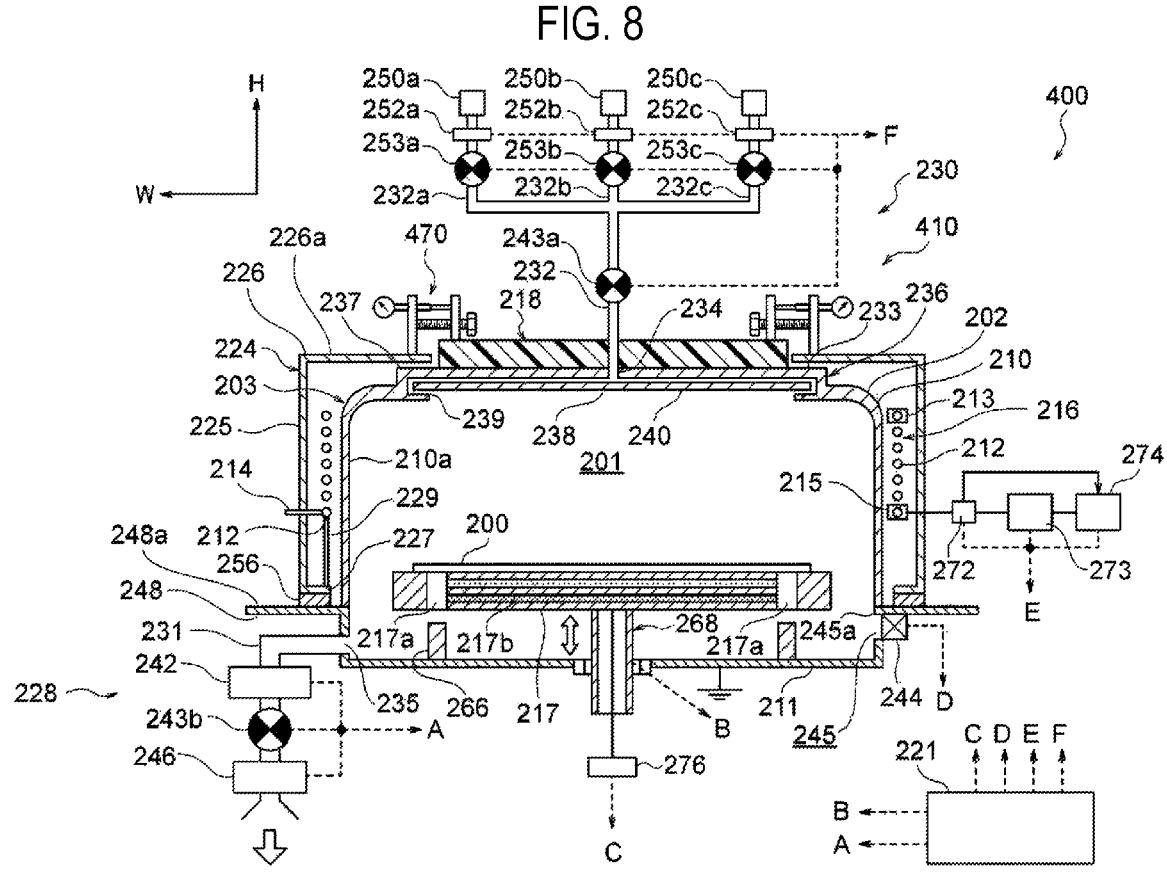
FIG. 8 is a schematic configuration diagram showing a substrate processing apparatus according to a second embodiment of the present disclosure.

As shown in FIG. 8, the mover 410 of the substrate processing apparatus 400 according to the second embodiment is not installed on the upper surface 248a of the base plate 248, but is installed on the upper surface 226a of the upper flange 226 of the shielding plate 224.

Figure 9:
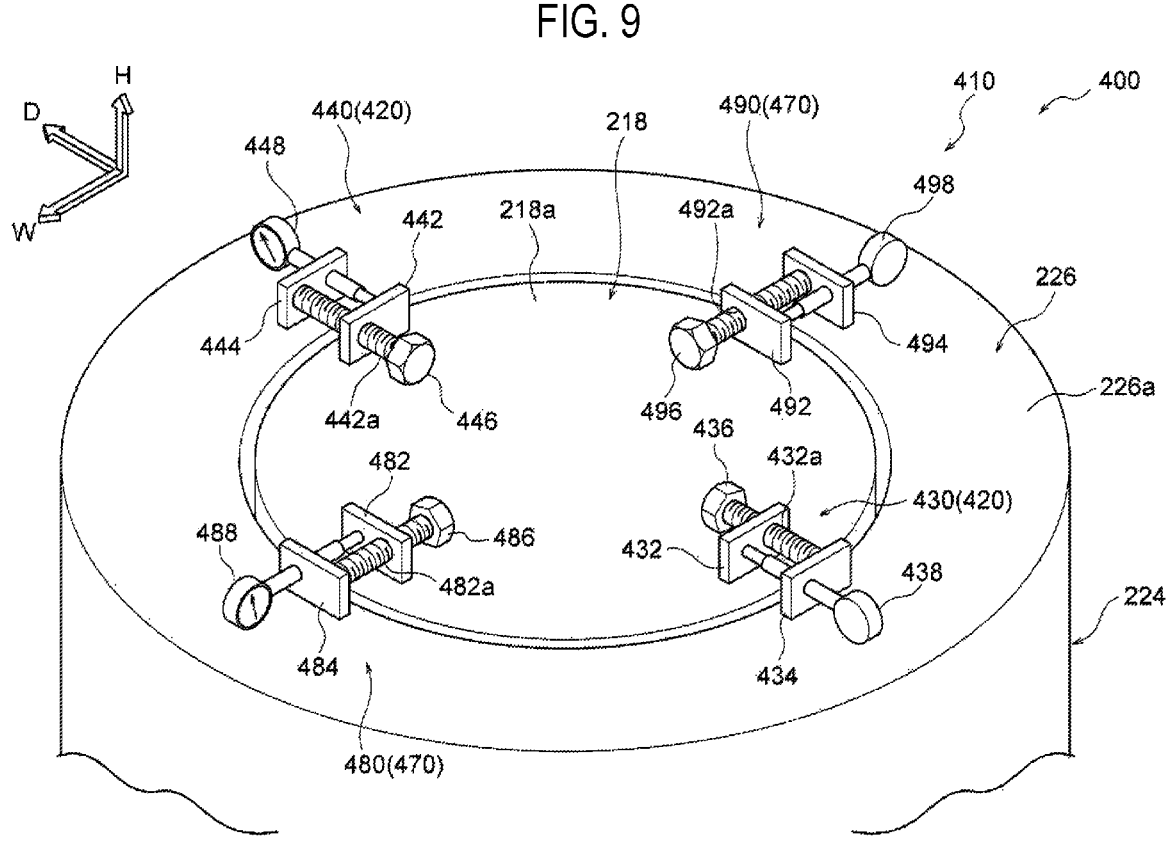
FIG. 9 is a perspective view showing a mover of the substrate processing apparatus according to the second embodiment of the present disclosure.

As shown in FIG. 9, the mover 410 is installed on the upper surface 226a of the upper flange 226 of the shielding plate 224, and includes a first mover 420 and a second mover 470.

The first mover 420 is configured to move the resonance coil 212 and the shielding plate 224 shown in FIG. 8 in the apparatus depth direction with respect to the process container 203, and the second mover 470 is configured to move the resonance coil 212 and the shielding plate 224 shown in FIG. 8 in the apparatus width direction with respect to the process container 203.

—First Mover 420—

As shown in FIG. 9, the first mover 420 includes an actuator 430 arranged on the front side in the apparatus depth direction on the upper surface 226a of the upper flange 226 of the shielding plate 224, and an actuator 440 arranged on the back side in the apparatus depth direction on the upper surface 226a of the upper flange 226 of the shielding plate 224. Further, as shown in FIG. 8, a disk-shaped disk portion 218 is installed on an upper surface of the lid 233 of the process container 203.

As shown in FIG. 9, the actuator 430 includes a plate 432 attached to the upper surface 218a of the disk portion 218, a plate 434 attached to the upper surface 226a of the upper flange 226 of the shielding plate 224, a bolt 436, and a gauge 438.

The plate 432 and the plate 434 face each other in the apparatus depth direction. The plate thickness direction of the plate 432 and the plate thickness direction of the plate 434 are the same as the apparatus depth direction. A female thread 432a is formed on the plate 432. The bolt 436 is fastened to the female thread 432a of the plate 432 from the inside in a container radial direction, and the tip of the bolt 436 is abutted against the plate surface of the plate 434. Further, the gauge 438 is attached to the plate 434. The gauge 438 measures the distance between the plate 432 and the plate 434 in the apparatus depth direction.

The actuator 440 includes a plate 442 attached to the upper surface 218a of the disk portion 218, a plate 444 attached to the upper surface 226a of the upper flange 226 of the shielding plate 224, a bolt 446, and a gauge 448.

The plate 442 and the plate 444 face each other in the apparatus depth direction. The plate thickness direction of the plate 442 and the plate thickness direction of the plate 444 are the same as the apparatus depth direction. A female thread 442a is formed on the plate 442. The bolt 446 is fastened to the female thread 442a of the plate 442 from the inside in the container radial direction, and the tip of the bolt 446 is abutted against the plate surface of the plate 444. Further, the gauge 448 is attached to the plate 444. The gauge 448 measures the distance between the plate 442 and the plate 444 in the apparatus depth direction.

In this configuration, by tightening the bolt 436 and loosening the bolt 446, the resonance coil 212 and the shielding plate 224 shown in FIG. 8 are moved toward the front side in the apparatus depth direction. Further, by loosening the bolt 436 and tightening the bolt 446, the resonance coil 212 and the shielding plate 224 shown in FIG. 8 are moved toward the back side in the apparatus depth direction.

—Second Mover 470—

As shown in FIG. 9, the second mover 470 an actuator 480 arranged on one side in the apparatus width direction on the upper surface 226a of the upper flange 226 of the shielding plate 224, and an actuator 490 arranged on the other side in the apparatus width direction on the upper surface 226a of the upper flange 226 of the shielding plate 224.

Figure 10:
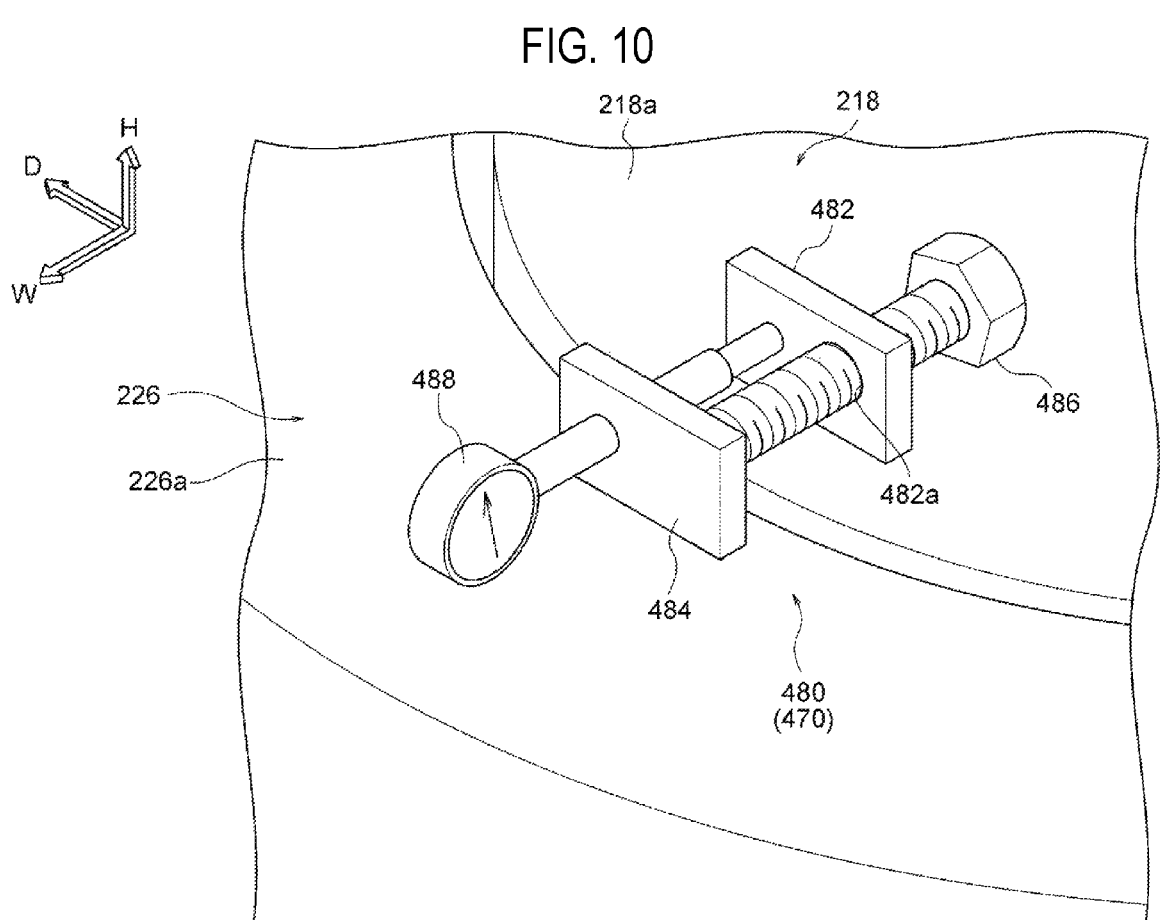
FIG. 10 is an enlarged perspective view showing the mover of the substrate processing apparatus according to the second embodiment of the present disclosure.

As shown in FIGS. 9 and 10, the actuator 480 includes a plate 482 attached to the upper surface 218a of the disk portion 218, a plate 484 attached to the upper surface 226a of the upper flange 226 of the shielding plate 224, a bolt 486, and a gauge 488.

The plate 482 and the plate 484 face each other in the apparatus width direction. The plate thickness direction of the plate 482 and the plate thickness direction of the plate 484 are the same as the apparatus width direction. A female thread 482a is formed on the plate 482. The bolt 486 is fastened to the female thread 482a of the plate 482 from the inside in a container radial direction, and the tip of the bolt 486 is abutted against the plate surface of the plate 484. Further, the gauge 488 is attached to the plate 484. The gauge 488 measures the distance between the plate 482 and the plate 484 in the apparatus width direction.

The actuator 490 includes a plate 492 attached to the upper surface 218a of the disk portion 218, a plate 494 attached to the upper surface 226a of the upper flange 226 of the shielding plate 224, a bolt 496, and a gauge 498.

The plate 492 and the plate 494 face each other in the apparatus width direction. The plate thickness direction of the plate 492 and the plate thickness direction of the plate 494 are the same as the apparatus width direction. A female thread 492a is formed on the plate 492. The bolt 496 is fastened to the female thread 492a of the plate 492 from the inside in the container radial direction, and the tip of the bolt 496 is abutted against the plate surface of the plate 494. Further, the gauge 498 is attached to the plate 494. The gauge 498 measures the distance between the plate 492 and the plate 494 in the apparatus width direction.

In this configuration, by tightening the bolt 48 and loosening the bolt 496, the resonance coil 212 and the shielding plate 224 shown in FIG. 8 are moved toward one side in the apparatus width direction. Further, by loosening the bolt 486 and tightening the bolt 496, the resonance coil 212 and the shielding plate 224 shown in FIG. 8 are moved toward the other side in the apparatus width direction.

According to the second embodiment, the actions other than the actions obtained by providing the drivers 340 and 390 in the first embodiment can be obtained.

Third Embodiment

An example of the third embodiment of the present disclosure will be described with reference to FIGS. 11 to 13. In addition, the parts of the third embodiment different from those of the second embodiment will be mainly described.

Figure 11:
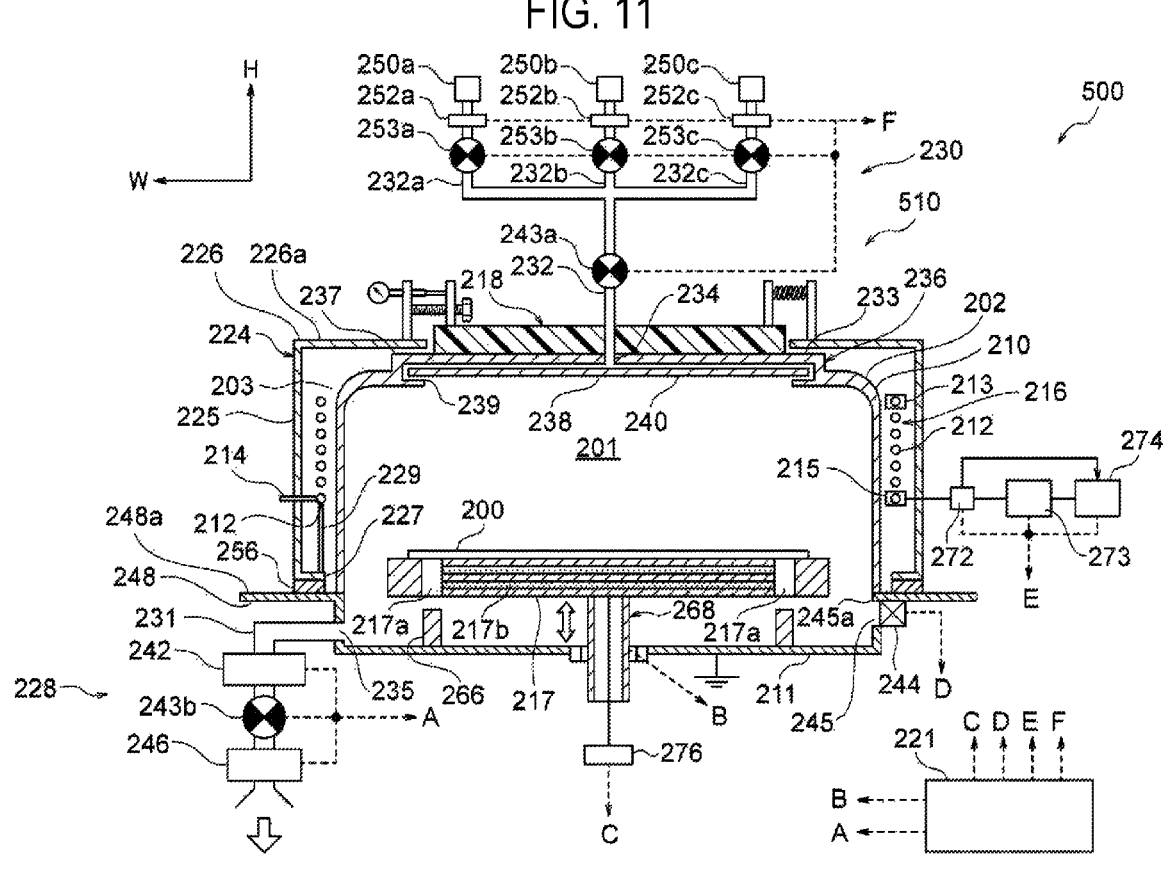
FIG. 11 is a schematic configuration diagram showing a substrate processing apparatus according to a third embodiment of the present disclosure.
Figure 12:
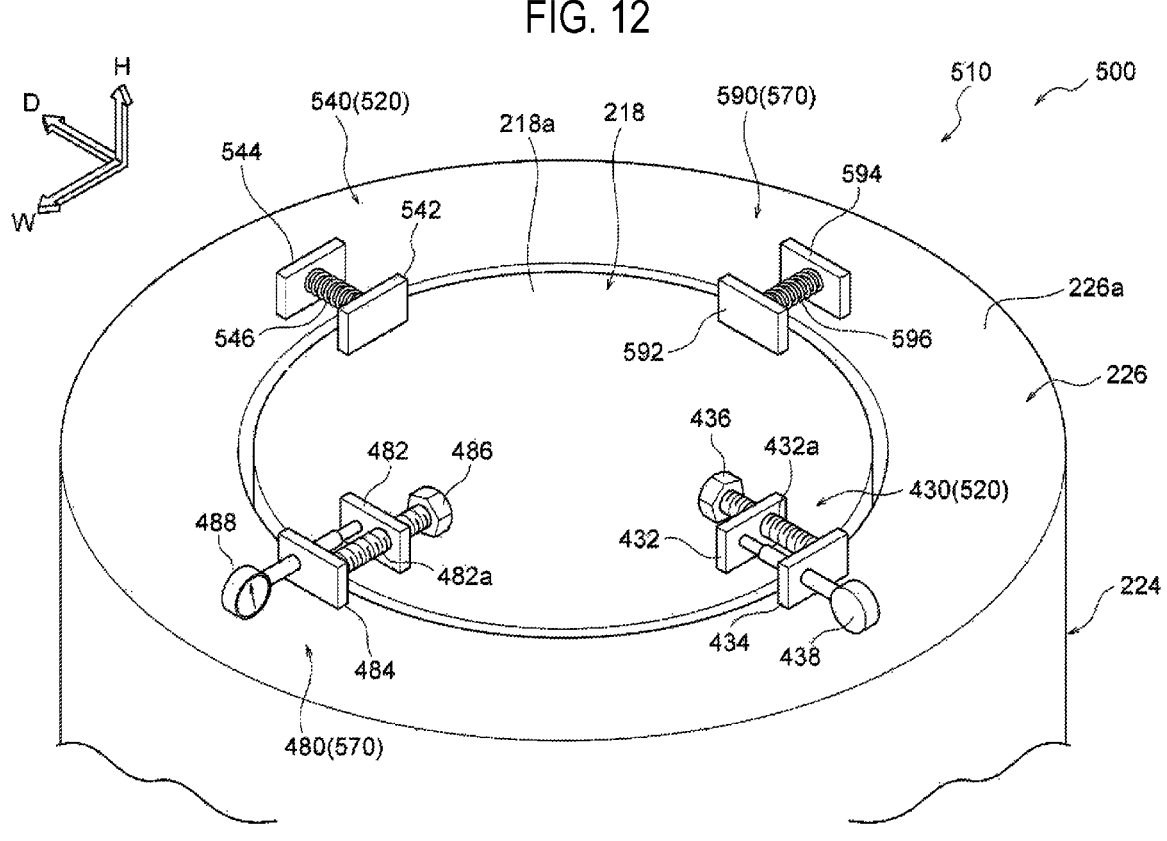
FIG. 12 is a perspective view showing a mover of the substrate processing apparatus according to the third embodiment of the present disclosure.

As shown in FIGS. 11 and 12, the mover 510 of the substrate processing apparatus 500 according to the third embodiment is installed on the upper surface 226a of the upper flange 226 of the shielding plate 224, and includes a first mover 520 and a second mover 570.

The first mover 520 is configured to move the resonance coil 212 and the shielding plate 224 shown in FIG. 11 in the apparatus depth direction with respect to the process container 203, and the second mover 570 is configured to move the resonance coil 212 and the shielding plate 224 shown in FIG. 11 in the apparatus width direction with respect to the process container 203.

—First Mover 520—

As shown in FIG. 12, the first mover 520 includes an actuator 430 arranged on the front side in the apparatus depth direction on the upper surface 226a of the upper flange 226 of the shielding plate 224, and an actuator 540 arranged on the back side in the apparatus depth direction on the upper surface 226a of the upper flange 226 of the shielding plate 224.

As shown in FIG. 12, the actuator 430 includes a plate 432 attached to the upper surface 218a of the disk portion 218, a plate 434 attached to the upper surface 226a of the upper flange 226 of the shielding plate 224, a bolt 436, and a gauge 438.

The actuator 540 includes a plate 542 attached to the upper surface 218a of the disk portion 218, a plate 544 attached to the upper surface 226a of the upper flange 226 of the shielding plate 224, and a piston (plunger) 546 biased by a compression coil spring.

The plate 542 and the plate 544 face each other in the apparatus depth direction. The plate thickness direction of the plate 542 and the plate thickness direction of the plate 544 are the same as the apparatus depth direction. The piston 546 is arranged in a state in which the plate 542 and the plate 544 are biased away from each other.

In this configuration, by tightening the bolt 436, the piston 546 is extended to move the resonance coil 212 and the shielding plate 224 shown in FIG. 11 toward the front side in the apparatus depth direction. Further, by loosening the bolt 436, the piston 546 is contracted to move the resonance coil 212 and the shielding plate 224 shown in FIG. 11 toward the back side in the apparatus depth direction.

—Second Mover 570—

As shown in FIG. 12, the second mover 570 includes an actuator 480, and an actuator 590 arranged on the other side in the apparatus width direction on the upper surface 226a of the upper flange 226 of the shielding plate 224.

Figure 13:
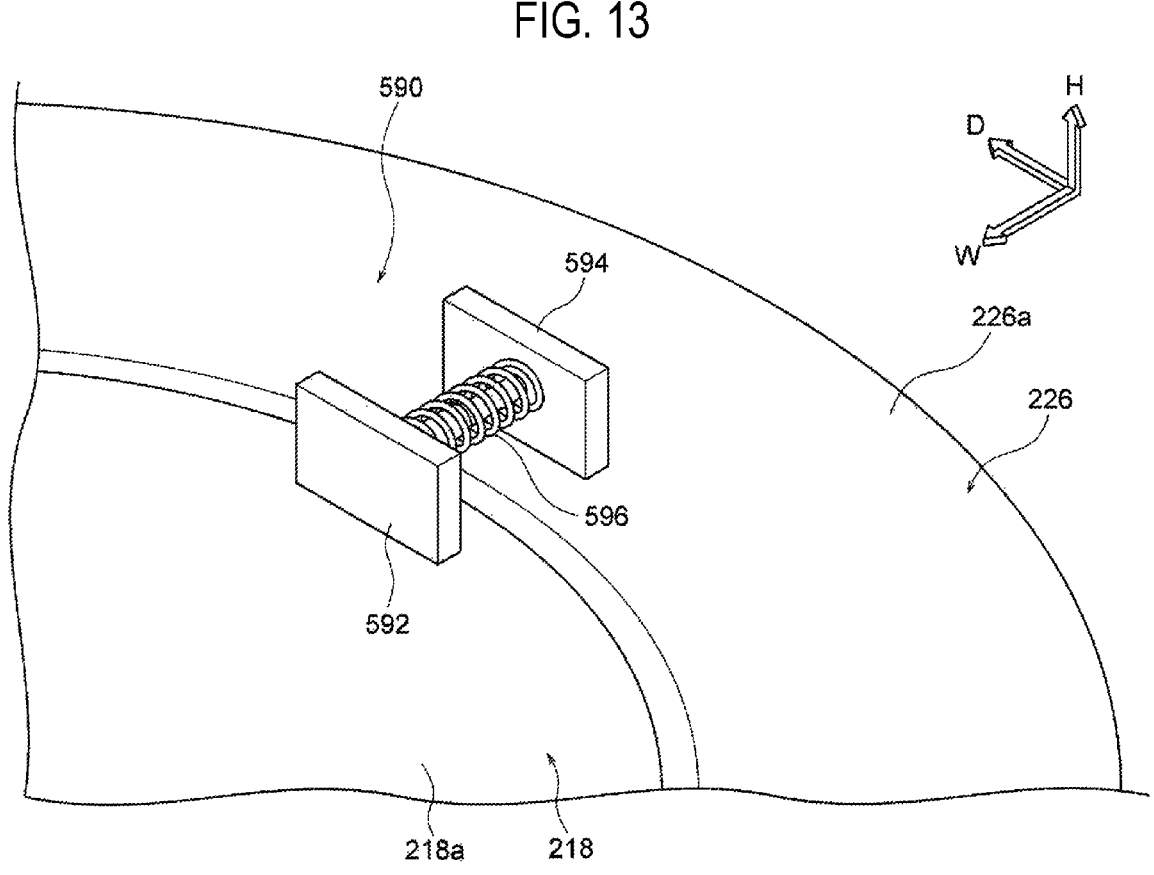
FIG. 13 is an enlarged perspective view showing a mover of a substrate processing apparatus according to a fourth embodiment of the present disclosure.

As shown in FIGS. 12 and 13, the actuator 590 includes a plate 592 attached to the upper surface 218a of the disk portion 218, a plate 594 attached to the upper surface 226a of the upper flange 226 of the shielding plate 224, and a piston (plunger) 596 biased by a compression coil spring.

The plate 592 and the plate 594 face each other in the apparatus width direction. The plate thickness direction of the plate 592 and the plate thickness direction of the plate 594 are the same as the apparatus width direction. The piston 596 is arranged so as to bias the plate 592 and the plate 594 away from each other.

In this configuration, by tightening the bolt 486, the piston 596 is extended to move the resonance coil 212 and the shielding plate 224 shown in FIG. 11 toward one side in the apparatus width direction. Further, by loosening the bolt 486, the piston 596 is contracted to move the resonance coil 212 and the shielding plate 224 shown in FIG. 11 toward the other side in the apparatus width direction.

According to the third embodiment, the actions other than the actions obtained by providing the drivers 340 and 390 in the first embodiment can be obtained.

Although the specific embodiments have been described above in detail, the present disclosure is not limited to such embodiments. It will be obvious to those skilled in the art that various other embodiments may be adopted within the scope of the present disclosure. For example, in the above-described embodiments, the resonance coil 212 is moved with respect to the process container 203 by moving the resonance coil 212 with respect to the process container 203. However, the process container 203 may be moved with respect to the resonance coil 212 to move the resonance coil 212 with respect to the process container 203.

Further, in addition to the processing conditions indicated in the above-described embodiments, the processing conditions may include at least the relative position between the resonance coil 212 and the wafer 200 to be processed in the axial direction of the cylindrical portion 210a of the process container 203 (in the apparatus up/down direction). Since the desired plasma distribution varies depending on such processing conditions, the plasma distribution in the process chamber 201 can be made into a desired distribution by storing the position of the resonance coil 212 with respect to the process container 203 for each of such processing conditions.

Further, in addition to the processing conditions indicated in the above-described embodiments, the processing conditions may include at least a type of the wafer 200 to be processed. Since the desired plasma distribution varies depending on such processing conditions, the plasma distribution in the process chamber 201 can be made into a desired distribution by storing the position of the resonance coil 212 with respect to the process container 203 for each of such processing conditions.

Further, in addition to the processing conditions indicated in the above-described embodiments, the processing conditions may include at least a processing time of the wafer 200 to be processed. Since the desired plasma distribution varies depending on such processing conditions, the plasma distribution in the process chamber 201 can be made into a desired distribution by storing the position of the resonance coil 212 with respect to the process container 203 for each of such processing conditions.

Further, in the above-described embodiments, the drivers 340 and 390 are kept in a non-operating state while the wafer 200 is being processed in the process chamber 201. However, the resonance coil 212 may be moved to a predetermined position of the resonance coil 212 with respect to the process container 203 by operating the drivers at a predetermined timing during the processing of the wafer 200. When the plasma distribution is biased after the processing is performed, the plasma distribution in the process chamber 201 can be made into a desired distribution by moving the resonance coil 212 during the processing so as to compensate for the bias.

Further, in the above-described embodiment, the position adjustment step S200 is performed after the substrate loading step S100. However, this order may be reversed, or these steps may be performed at the same time.

According to the present disclosure in some embodiments, the plasma distribution in the process chamber can be made into a desired distribution along the circumferential direction of the process container.

While certain embodiments have been described, these embodiments have been presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising: a process container including a cylindrical portion, in which a process chamber is formed, a substrate being arranged in the process chamber;

a gas supplier configured to supply a processing gas to the process chamber;

an electrode installed in a spiral shape to surround the process container from outside of the cylindrical portion of the process container and supplied with high-frequency power to plasma-excite the processing gas;

a shield configured to surround the electrode from outside in a radial direction of the cylindrical portion and to shield an electric field generated by the electrode;

a first mover configured to move the electrode and the shield integrally, with respect to the process container in a first horizontal direction of the cylindrical portion; and a second mover configured to move the electrode and the shield integrally, with respect to the process container in a second horizontal direction of the cylindrical portion, which is orthogonal to the first horizontal direction.

2. The apparatus of claim 1, wherein the first mover includes:

a first movable part installed directly or indirectly on the electrode and the shield and configured to move integrally with the electrode; and a first adjuster configured to move the first movable part to adjust a position of the first movable part, and wherein the second mover includes:

a second movable part installed directly or indirectly on the electrode and the shield and configured to move integrally with the electrode; and a second adjuster configured to move the second movable part to adjust the position of the second movable part.

3. The apparatus of claim 2, wherein the first mover includes a first driver configured to operate the first adjuster, and the second mover includes a second driver configured to operate the second adjuster.

4. The apparatus of claim 3, further comprising:

an input part configured to receive an input of movement information for moving the electrode from an operator; and a controller configured to be capable of controlling the first driver and to operate the first adjuster by the first driver based on the movement information inputted to the input part, and configured to be capable of controlling the second driver and to operate the second adjuster by the second driver based on the movement information inputted to the input part.

5. The apparatus of claim 4, further comprising a memory configured to store:

the movement information including process conditions; and relative positions of the electrode with respect to the process container, which correspond to the processing conditions, wherein the controller is configured to be capable of controlling the first driver and the second driver based on the processing conditions, which are inputted through the input part, and the relative positions of the electrode with respect to the process container corresponding to the processing conditions, which are stored in the memory.

6. The apparatus of claim 5, wherein the processing conditions include at least one selected from a group of a temperature of the substrate to be processed, a pressure in the process chamber, a type of the processing gas for processing the substrate, a flow rate of the processing gas, and high-frequency power supplied to the electrode.

7. The apparatus of claim 5, wherein the processing conditions include at least a relative position between the electrode and the substrate in a direction perpendicular to a surface of the substrate to be processed in the process chamber.

8. The apparatus of claim 5, wherein the processing conditions include at least a type of the substrate to be processed.

9. The apparatus of claim 5, wherein the processing conditions include at least a processing time of the substrate to be processed.

10. The apparatus of claim 4, wherein the controller keeps the first driver and the second driver in a non-operating state while the substrate is being processed.

11. The apparatus of claim 4, wherein at a predetermined timing while the substrate is processed in the process chamber, the controller operates the first driver and the second driver to move the electrode to a predetermined position.

12. The apparatus of claim 1, further comprising a high-frequency power source configured to supply high-frequency power having a wavelength, which is an integer multiple of an electrical length of the electrode, to the electrode.

13. The apparatus of claim 1, further comprising a support part configured to support the shield and the electrode from below, wherein the first mover and the second mover move the shield and the electrode by moving the support part.

14. The apparatus of claim 4, further comprising a display configured to display an amount of movement of the electrode with respect to a predetermined reference position.

15. The apparatus of claim 2, wherein the first movable part includes:

a first bottom base portion inserted into a first bottom guide groove extending along the first horizontal direction and formed on an upper surface of a base plate, a first upper base portion inserted into a first upper guide groove extending along the second horizontal direction and formed on an upper surface of the first bottom base portion, and wherein the second movable part includes:

a second bottom base portion inserted into a second bottom guide groove extending along the second horizontal direction and formed on the upper surface of the base plate, a second upper base portion inserted into a second upper guide groove extending along the first horizontal direction and formed on an upper surface of the second bottom base portion.

16. The apparatus of claim 15, further comprising a support part configured to support the shield and the electrode from below, wherein the first upper base portion and the second upper base portion are fixed to the support part respectively.

\*   \*   \*   \*   \*